US012563811B2

(12) United States Patent
Park et al.

(10) Patent No.: US 12,563,811 B2
(45) Date of Patent: Feb. 24, 2026

(54) INTEGRATED CIRCUIT DEVICE

(71) Applicant: Samsung Electronics Co., Ltd., Suwon-si (KR)

(72) Inventors: Joonsoo Park, Suwon-si (KR); Bongjin Kuh, Suwon-si (KR); Bongsoo Kim, Suwon-si (KR); Yoonjae Kim, Suwon-si (KR); Dongsoo Woo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 332 days.

(21) Appl. No.: 18/337,952

(22) Filed: Jun. 20, 2023

(65) Prior Publication Data

US 2024/0105790 A1     Mar. 28, 2024

(30) Foreign Application Priority Data

Sep. 23, 2022     (KR) ........................ 10-2022-0121144

(51) Int. Cl.
   H10D 64/27     (2025.01)
   H10B 12/00     (2023.01)
   H10D 1/68     (2025.01)
(52) U.S. Cl.
   CPC ......... H10D 64/513 (2025.01); H10B 12/315 (2023.02); H10B 12/482 (2023.02); H10B 12/488 (2023.02); H10D 1/692 (2025.01)
(58) Field of Classification Search
   CPC .... H10D 64/513; H10D 1/692; H10B 12/315; H10B 12/482; H10B 12/488
   See application file for complete search history.

(56) References Cited

U.S. PATENT DOCUMENTS

| | | | |
|---|---|---|---|
| 6,537,870 | B1 | 3/2003 | Shen |
| 6,734,482 | B1 | 5/2004 | Tran et al. |
| 6,806,137 | B2 | 10/2004 | Tran et al. |
| 7,349,232 | B2 | 3/2008 | Wang et al. |
| 7,768,073 | B2 | 8/2010 | Wells |
| 8,274,112 | B2 | 9/2012 | Kim et al. |

(Continued)

FOREIGN PATENT DOCUMENTS

| | | |
|---|---|---|
| CN | 114220765 A | 3/2022 |
| KR | 10-2001-0097949 A | 11/2001 |
| KR | 100668836 B1 | 1/2007 |

OTHER PUBLICATIONS

Extended European Search Report dated Apr. 3, 2024 for corresponding European Application No. 23184371.5.

*Primary Examiner* — Samuel A Gebremariam
(74) *Attorney, Agent, or Firm* — Harness, Dickey & Pierce, P.L.C.

(57)     ABSTRACT

Provided is an integrated circuit device including a substrate including a first active area and a second active area each extending in a first direction, a bit line extending in the first direction in a first trench of the substrate and arranged between the first active area and the second active area in a second direction perpendicular to the first direction, a contact structure including a lower contact contacting the bit line and an upper contact contacting the first active area, a word line extending in the second direction in a second trench of the substrate, a plurality of landing pads on the substrate, and a capacitor structure including a plurality of lower electrodes on the plurality of landing pads, wherein the bit line and the word line are buried under an upper surface of the substrate.

20 Claims, 46 Drawing Sheets

(56)           References Cited

U.S. PATENT DOCUMENTS

| | | |
|---|---|---|
| 8,716,772 B2 | 5/2014 | Wang et al. |
| 2006/0043450 A1 | 3/2006 | Tang et al. |
| 2006/0258084 A1 | 11/2006 | Tang et al. |
| 2008/0242084 A1 | 10/2008 | Kim et al. |
| 2008/0280408 A1 | 11/2008 | Park |
| 2011/0220994 A1 | 9/2011 | Parekh et al. |
| 2020/0286894 A1 | 9/2020 | Lin |
| 2022/0059694 A1 | 2/2022 | Luo |

INTEGRATED CIRCUIT DEVICE

CROSS-REFERENCE TO RELATED APPLICATION

This application is based on and claims priority under 35 U.S.C. § 119 to Korean Patent Application No. 10-2022-0121144, filed on Sep. 23, 2022, in the Korean Intellectual Property Office, the disclosure of which is incorporated by reference herein in its entirety.

BACKGROUND

The inventive concepts relate to integrated circuit devices, and more particularly, to integrated circuit devices including a buried channel array transistor.

Recently, as the degree of integration of integrated circuit devices has gradually increased, the integrated circuit device has been proposed having a structure having a buried channel array transistor (BCAT) in which a plurality of word lines are buried in a substrate. Thus, there has been conducted various studies for improving and stabilizing the operation and reliability of buried channel array transistors.

SUMMARY

The inventive concepts provide integrated circuit devices having improved reliability.

According to some aspects of the inventive concepts, there is provided an integrated circuit device including a substrate including a first active area and a second active area each extending in a first direction, a bit line extending in the first direction in a first trench of the substrate and arranged between the first active area and the second active area in a second direction substantially perpendicular to the first direction, a first capping insulation layer on the bit line in the first trench of the substrate, a first spacer positioned between the substrate and the bit line, a contact structure including a lower contact and an upper contact on the lower contact, the lower contact penetrating through the first capping insulation layer to be in contact with the bit line and the upper contact being in contact with the first active area, a word line extending in the second direction in a second trench of the substrate, a second capping insulation layer on the word line in the second trench of the substrate, a second spacer positioned between the substrate and the word line, a plurality of landing pads on the substrate, and a capacitor structure including a plurality of lower electrodes on the plurality of landing pads, an upper electrode over the plurality of lower electrodes, and a dielectric film between the plurality of lower electrodes and the upper electrode. The bit line and the word line may be buried under an upper surface of the substrate, and the plurality of landing pads may be on the upper surface of the substrate.

According to some aspects of the inventive concepts, there is provided an integrated circuit device including a substrate including an active area extending in a first direction, at least one pair of device isolation layers positioned in the substrate and spaced apart in the first direction such that the active area is positioned between the at least one pair of device isolation layers, a bit line buried in the substrate and extending in the first direction, a plurality of word lines buried in the substrate and extending in a second direction substantially perpendicular to the first direction, a contact structure including a lower contact in contact with the bit line and an upper contact in contact with an upper portion of the active area, a plurality of landing pads on the substrate, and a capacitor structure including a plurality of lower electrodes positioned on the plurality of landing pads, respectively. The active area may include source/drain regions divided by the plurality of word lines in the first direction, and some of the source/drain regions may be in contact with the upper contact and a rest of the source/drain regions may be in contact with the plurality of landing pads.

According to some aspects of the inventive concepts, there is provided an integrated circuit device including a substrate including a first active area and a second active area each extending in a first direction, a bit line extending in the first direction in a first trench of the substrate and arranged between the first active area and the second active area in a second direction substantially perpendicular to the first direction, a first capping insulation layer on the bit line in the first trench of the substrate, a contact structure including a lower contact and an upper contact on the lower contact, the lower contact penetrating through the first capping insulation layer to be in contact with the bit line and the upper contact being in contact with the first active area, a first spacer positioned between the substrate and the bit line and between the substrate and the lower contact and in contact with the lower contact, two device isolation layers positioned in the substrate and spaced apart in the first direction such that the first active area is positioned between the two device isolation layers, a plurality of word lines extending in the second direction substantially perpendicular to the first direction and positioned in a plurality of second trenches provided in the substrate to pass through the first active area in the second direction, a plurality of second capping insulation layers positioned on the plurality of word lines, respectively, in the plurality of second trenches of the substrate, a plurality of second spacers positioned between the substrate and the plurality of word lines, respectively, a plurality of landing pads on the substrate, and a capacitor structure including a plurality of lower electrodes on the plurality of landing pads, respectively, an upper electrode over the plurality of lower electrodes, and a dielectric film between the plurality of lower electrodes and the upper electrode. The bit line, the contact structure, and the plurality of word lines may be buried under an upper surface of the substrate, and the plurality of landing pads may be on the upper surface of the substrate. A pair of most neighboring lower electrodes may be arranged in a line in the first direction among the plurality of the lower electrodes.

BRIEF DESCRIPTION OF THE DRAWINGS

Example embodiments will be more clearly understood from the following detailed description taken in conjunction with the accompanying drawings in which.

DETAILED DESCRIPTION

Figure 1:
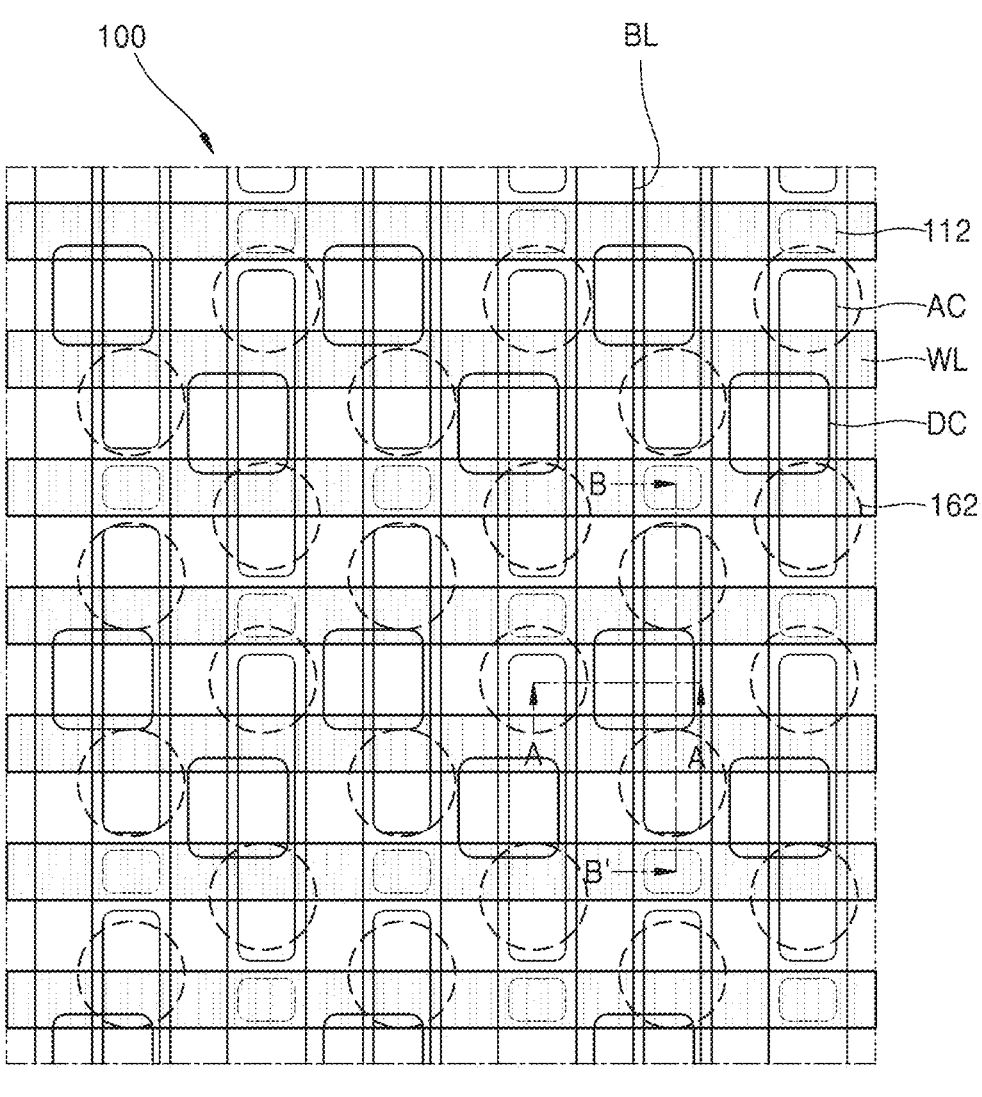
FIG. 1 is a layout diagram showing an integrated circuit device 100, according to some example embodiments.
Figure 1:
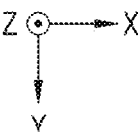

Hereinafter, some example embodiments of the technical ideas of the inventive concepts will be described in detail with reference to the accompanying drawings. The same reference numerals denote the same elements in the drawings, and duplicate descriptions on the same elements are omitted.

Figure 2A:
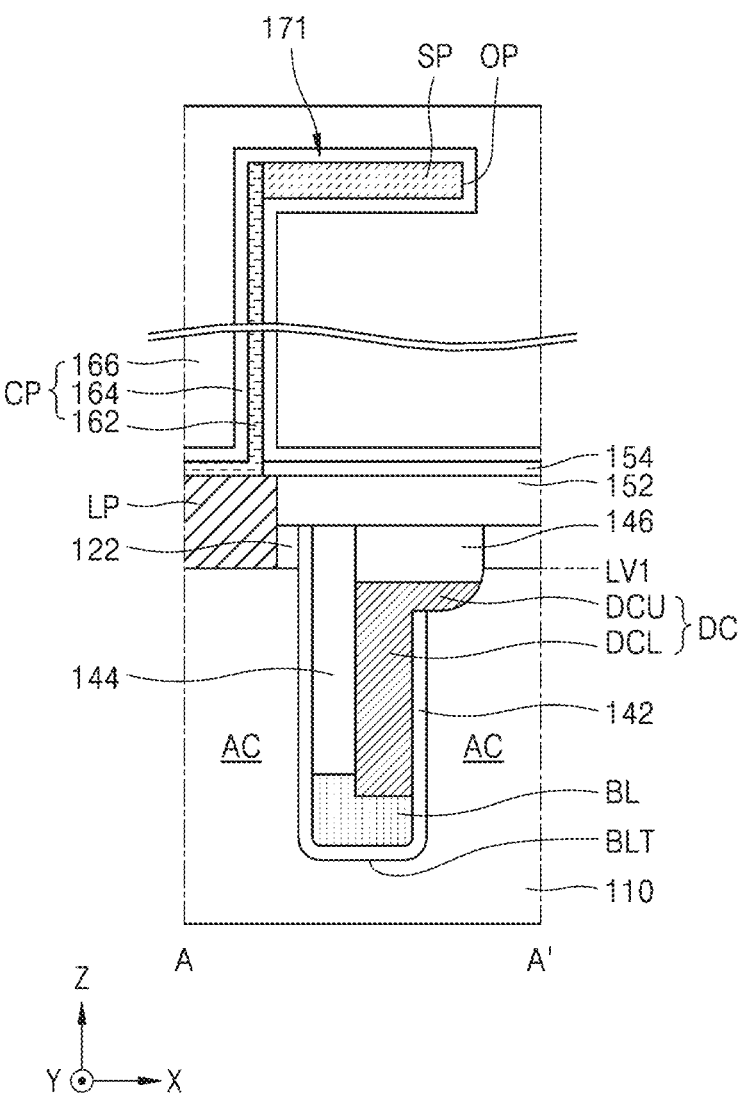
FIG. 2A is a cross-sectional view cut along a line A-A' of FIG. 1.
Figure 2B:
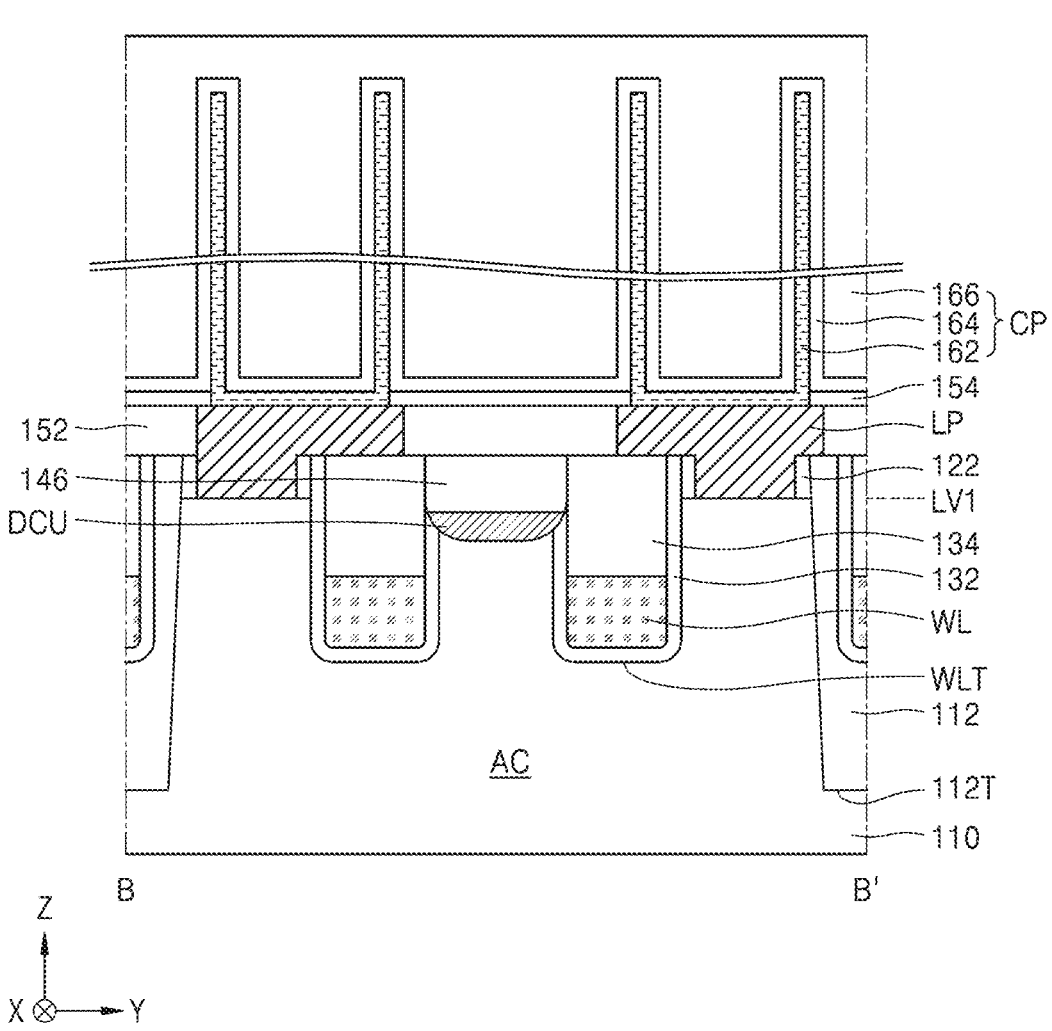
FIG. 2B is a cross-sectional view cut along a line B-B' of FIG. 1.
Figure 3:
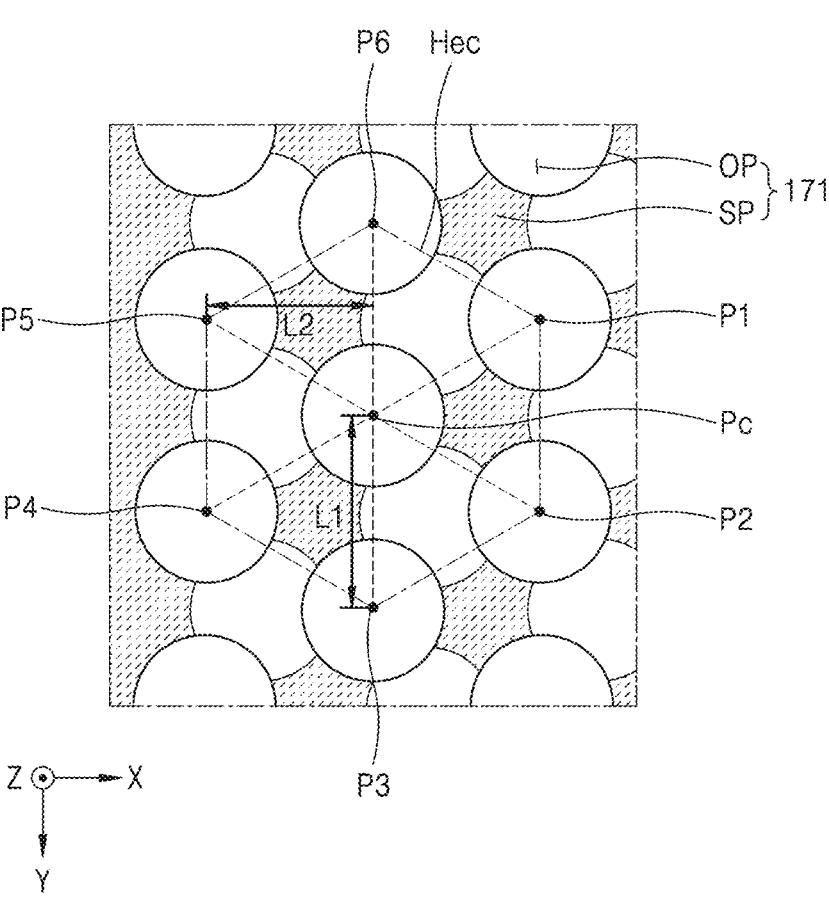
FIG. 3 is a plan view illustrating a partial structure of an integrated circuit device, according to some example embodiments.

FIG. 1 is a layout diagram showing an integrated circuit device 100, according to some example embodiments. FIG. 2A is a cross-sectional view cut along a line A-A' of FIG. 1. FIG. 2B is a cross-sectional view cut along a line B-B' of FIG. 1. FIG. 3 is a plan view illustrating a partial structure of an integrated circuit device 100, according to some example embodiments.

Referring to FIGS. 1 to 3, an integrated circuit device 100 may include a substrate 110 having a plurality of active areas AC, a plurality of bit lines BL buried in the substrate 110, and a plurality of word lines WL buried in the substrate 110. In some example embodiments, the plurality of active areas AC, the plurality of bit lines BL, and the plurality of word lines WL may be arranged in such a configuration that the integrated circuit device 100 has a 6F2 unit cell structure. Herein, the capital letter "F" may indicate a minimum feature size.

The substrate 110 may include silicon, for example, monocrystalline silicon, polycrystalline silicon, or amorphous silicon. In some example embodiments, the substrate 110 may include at least one of germanium (Ge), silicon germanium (SiGe), silicon carbide (SiC), gallium arsenide (GaAs), indium arsenide (InAs), and indium phosphide (InP). In some example embodiments, the substrate 110 may include a conductive area, for example, a well doped with impurities or a structure doped with impurities. A first insulating layer 122 may be disposed on an upper surface of the substrate 110. The first insulating layer 122 may include silicon oxide. Hereinafter, a first direction (Y direction) and a second direction (X direction) are defined as directions that are parallel with the upper surface of the substrate 110 and perpendicular to each other, and a vertical direction (Z direction) is defined as a direction perpendicular to the upper surface of the substrate 110.

The substrate 110 may include a plurality of active areas AC extending linearly in the first direction (Y direction). In a plan view, a major axis of each active area AC may be parallel to the first direction (Y direction), and a minor axis of each active area AC may be parallel to the second direction (X direction). Each active area AC may include, in an upper portion thereof, source/drain regions that are formed by an ion implantation process and spaced apart in the first direction (Y direction).

A plurality of device isolation layers 112 may be arranged on the substrate 110, and the plurality of active areas AC may be defined by the device isolation layers 112. Each of the device isolation layer 112 may include an insulation material filling the device isolation trench 112T of the substrate 110. Two device isolation layers 112 may be spaced apart in the first direction (Y direction) with a single active area AC therebetween, and a single device isolation layer 112 may be positioned between two active areas AC adjacent to each other in the first direction (Y direction). Each of the device isolation layers 112 may include an oxide layer, a nitride layer, and/or a combination thereof.

The plurality of bit lines BL may be provided in a plurality of bit line trenches BLT in the substrate 110. The plurality of bit line trenches BLT may extend in the first direction (Y direction) and may be spaced apart from each other in the second direction (X direction). The plurality of bit lines BL may extend in the first direction (Y direction) and may be spaced apart from each other in the second direction (X direction). Each bit line BL may be filled in a lower portion of the corresponding bit line trench BLT. The plurality of bit lines BL may include a conductive material, for example, silicon (Si), germanium (Ge), tungsten (W), tungsten nitride (WN), cobalt (Co), nickel (Ni), aluminum (Al), molybdenum (Mo), ruthenium (Ru), titanium (Ti), titanium nitride (TiN), tantalum (Ta), tantalum nitride (TaN), copper (Cu), and/or a combination thereof. Each of the bit lines BL may include a single conductive layer or a multi-layered conductive layer.

A plurality of bit line capping insulation layers 144 may be positioned on the plurality of bit lines BL, respectively. Each of the bit line capping insulation layer 144 may partially cover an upper surface of the corresponding individual bit line BL provided in the corresponding bit line trench BLT. Each bit line capping insulation layer 144 may extend in the vertical direction (Z direction) from the upper surface of the corresponding bit line BL toward the upper surface of the substrate 110. The bit line capping insulation layer 144 may include, for example, silicon oxide.

A plurality of bit line spacers 142 may be positioned in the plurality of bit line trenches BLT, respectively. Each bit line spacer 142 may extend along the surface of the substrate 110 which defines the corresponding bit line trench BLT. Each bit line spacer 142 may extend along bottom and sidewalls of the corresponding bit line BL, and may be positioned between the corresponding bit line BL and the substrate 110. Each bit line spacer 142 may include an insulating material, such as silicon oxide, silicon nitride, silicon oxynitride, and a combination thereof. In some example embodiments, the bit line spacer 142 may include a material having an etch selectivity with respect to the bit line capping insulation layer 144. In some example embodiments, each bit line spacer 142 may include silicon nitride, and each bit line capping insulation layer 144 may include silicon oxide.

Each bit line BL may be connected to the active area AC by a corresponding bit line contact structure DC. Each bit line BL may be electrically connected to the corresponding active area AC by the corresponding bit line contact structure DC. In some example embodiments, a vertical level of an upper surface of each bit line contact structure DC may be equal to or lower than a vertical level LV1 of the upper surface of the substrate 110. In some example embodiments, the bit line contact structure DC may be buried under the upper surface of the substrate 110.

Each bit line contact structure DC may include a lower contact DCL in contact with the corresponding bit line BL and an upper contact DCU in contact with the corresponding active area AC. The upper contact DCU may be positioned on the lower contact DCL, and a horizontal dimension of the upper contact DCU may be greater than that of the lower contact DCL. For example, the length of the upper contact DCU in the first direction (Y direction) and/or the second direction (X direction) may be greater than the length of the lower contact DCL in the first direction (Y direction) and/or the second direction (X direction). The lower contact DCL may make contact with an upper surface of the corresponding bit line BL and may extend in the vertical direction (Z direction) along a first portion of the corresponding bit line spacer 142. The upper contact DCU may protrude from the sidewall of the lower contact DCL in a lateral direction and may make contact with the corresponding active area AC. The corresponding active area AC in contact with the upper contact DCU may include a recessed surface 119 in FIGS. 15A and 15B. The upper contact DCU extends laterally beyond the first portion of the corresponding bit line spacer 142 and may make contact with the recessed surface 119 of the corresponding active area AC. The interface between the upper contact DCU and the lower contact DCL may be at a height in the third direction (Z direction) at or about the same height of the bit line spacer 142 contacting the bit line contact structure DC.

Herein, two active areas AC may be spaced apart in the second direction (X direction) with the bit line BL therebetween, and one of the active areas AC making contact with the bit line BL via the bit line contact structure DC may be referred to as first active area, while the other active area AC making contact with the bit line BL via the bit line contact structure DC may be referred to as second active area. The bit line contact structure DC may extend further into the bit line BL than the bit line capping insulation layer 144.

A plurality of contact cover insulating layers 146 may be positioned on the plurality of bit line contact structures DC, respectively. The plurality of contact cover insulating layers 146 may be arranged on the upper surface of the substrate 110 while covering the plurality of bit line contact structures DC. Each contact cover insulating layer 146 may include, for example, silicon oxide, silicon nitride, silicon oxynitride, and a combination thereof. The bit line capping insulation layer 144 and a corresponding contact cover insulating layer 146 may have coplanar or about coplanar top surfaces.

The plurality of word lines WL may be provided in the plurality of word line trenches WLT in the substrate 110. The plurality of word line trenches WLT may extend in the second direction (X direction) and be spaced apart from each other in the first direction (Y direction). The plurality of word lines WL may extend in a direction crossing the plurality of bit lines BL. The plurality of word lines WL may extend in the second direction (X direction) and may be spaced apart from each other in the first direction (Y direction). Each word line WL may fill a lower portion of the corresponding word line trench WLT. Each word line WL may include a conductive material, for example, silicon (Si), germanium (Ge), tungsten (W), tungsten nitride (WN), cobalt (Co), nickel (Ni), aluminum (Al), molybdenum (Mo), ruthenium (Ru), titanium (Ti), titanium nitride (TiN), tantalum (Ta), tantalum nitride (TaN), copper (Cu), and/or a combination thereof. Each word line WL may include a single conductive layer or a multi-layered conductive layer. As illustrated in FIG. 2B, two word lines WL may be provided in a single active area AC in such a configuration that two word lines WL extend in the second direction (X direction) across the active area AC, and the upper contact DCU may be positioned between the two word lines WL.

A plurality of word line capping insulation layers 134 may be positioned on the plurality of word lines WL, respectively. Each word line capping insulation layer 134 may cover an upper surface of the corresponding word line WL provided in the corresponding word line trench WLT. Each word line capping insulation layer 134 may extend in the vertical direction (Z direction) from the upper surface of the corresponding word line WL toward the upper surface of the substrate 110.

A plurality of word line spacers 132 may be positioned in the plurality of word line trenches WLT, respectively. Each word line spacer 132 may extend along the surface of the substrate 110 defining the corresponding word line trench WLT. Each word line spacer 132 may extend along a bottom surface and sidewalls of the corresponding word line WL, and may be positioned between the corresponding word line WL and the substrate 110. Each word line spacer 132 may include an insulating material, such as silicon oxide, silicon nitride, silicon oxynitride, an oxide/nitride/oxide (ONO) film, and/or a high-k dielectric film having a higher dielectric constant than silicon oxide. The word line spacer 132 may also be referred to as a gate insulating layer.

The bit line trench BLT may be deeper than the word line trench WLT. That is, the distance between the upper surface of the substrate 110 and the bottom of the bit line trench BLT may be greater than the distance between the upper surface of the substrate 110 and the bottom of the word line trench WLT in the vertical direction (Z direction). In addition, the bit line BL may be positioned under the word line WL. That is, the distance between the upper surface of the substrate 110 and the upper surface of the bit line BL may be greater than the distance between the upper surface of the substrate 110 and the upper surface of the word line WL in the vertical direction (Z direction).

The integrated circuit device 100 may include a plurality of landing pads LP arranged on the upper surface of the substrate 110. The plurality of landing pads LP may be connected to the plurality of active areas AC of the substrate 110. The plurality of landing pads LP may be spaced apart from each other on the upper surface of the substrate 110 and may be shaped into an island pattern. For example, in such a configuration that two word lines WL pass through each active area AC in the second direction (X direction), and thus, each active area AC is divided, by the two word lines WL, into three sections corresponding to three source/drain regions, which are spaced apart in the first direction (Y direction), the upper contact DCU of the bit line contact structure DC may be connected to a central section among the three sections, and two landing pads LP may be respectively connected to the rest two sections. For example, each landing pad LP may include a conductive barrier layer and a conductive layer. For example, the conductive barrier layer of the landing pad LP may include titanium (Ti), titanium nitride (TiN), and/or a combination thereof. For example, the conductive layer of the landing pad LP may include metal, metal nitride, conductive polysilicon, and/or a combination thereof.

An insulating pattern 152 may be arranged between the plurality of landing pads LP in such a configuration that sidewalls of the landing pads LP are enclosed by the insulating pattern 152. The plurality of landing pads LP may be electrically insulated from each other by the insulating pattern 152. For example, the insulating pattern 152 may include silicon nitride, silicon oxide, silicon oxynitride, and a combination thereof.

The integrated circuit device 100 may include a capacitor structure CP on the substrate 110. The capacitor structure CP includes a plurality of lower electrodes 162 arranged on a plurality of landing pads LP, an upper electrode 166 arranged on the plurality of lower electrodes 162, and a dielectric layer 164 arranged between the upper electrode 166 and the plurality of lower electrodes 162. An etch stop pattern 154 may be positioned on the insulating pattern 152 and each portion of the plurality of landing pads LP and may make contact with a lower portion of a sidewall of each of the plurality of lower electrodes 162.

Although the lower electrode 162 is illustrated as a cylindrical structure in FIGS. 1 to 3, the structure of the lower electrode 162 is not limited to the cylindrical structure, and, for example, the lower electrode 162 may have a pillar structure. The dielectric layer 164 may conformally extend on surfaces of the plurality of lower electrodes 162. The plurality of lower electrodes 162 and the upper electrode 166 may be electrically separated, so that the plurality of lower electrodes 162 and the upper electrode 166 may function as a capacitor. The dielectric layer 164 may include at least one selected from silicon oxide, silicon nitride, silicon oxynitride, and a high dielectric material. The upper electrode 166 may be formed to cover the plurality of lower electrodes 162. The upper electrode 166 may include any one of a metal nitride, a metal, and a combination thereof. For example, the upper electrode 166 may include at least one selected from titanium nitride (TiN), ruthenium (Ru), tantalum nitride (TaN), tungsten nitride (WN), platinum (Pt), and iridium (Jr).

Among the plurality of lower electrodes 162, the two most neighboring lower electrodes 162 may be arranged side by side in the first direction (Y direction). In other words, the pair of most neighboring (in the first (Y) direction and the second (X) direction) lower electrodes 162 may be arranged in a straight line parallel to the first direction (Y direction). Among the plurality of lower electrodes 162, the lower electrodes 162 arranged side by side in the first direction (Y direction) may be provided as a single column. A pair of lower electrodes 162 of the single column may have a constant first pitch between centers thereof in the first direction (Y direction). Any one of the pair of lower electrodes 162 in a column may be shifted from a closest lower electrode 162 in the next column by a certain distance, e.g., a half of the first pitch, in the first direction (Y direction), so that the lower electrodes 162 may be arranged within a limited area as many as possible. Accordingly, in a plan view, the plurality of lower electrodes 162 may be arranged in a zigzag or staggered shape. In other words, the plurality of lower electrodes 162 may be arranged such that they are closer to one another in the first direction (Y direction) and further from one another in the second direction (X direction) while maintaining a regular hexagon.

The plurality of lower electrodes 162 may be arranged on the upper surface of the substrate 110 in a honeycomb structure. In a plan view, the honeycomb structure of the plurality of lower electrodes 162 may be defined by six lower electrodes 162 positioned at six vertexes P1, P2, P3, P4, P5, and P6 of a hexagon Hec and by a single lower electrode 162 positioned at a center point Pc of the hexagon Hec. Thus, the plurality of lower electrodes 162 may be arranged in such a configuration that a plurality of honeycomb structures continuously and partially overlap in the first direction (Y direction) and the second direction (X direction). That is, the lower electrodes 162 positioned at six vertexes P1, P2, P3, P4, P5, and P6 and the center point Pc of the hexagon Hec may be provided as a honeycomb structure, and each lower electrode 162 at six vertexes P1, P2, P3, P4, P5, and P6 of the hexagon Hec may be provided as center points of other hexagons for other honeycomb structures, respectively. In some example embodiments, the hexagon for the honeycomb structure may include a regular hexagon (e.g., having common length sides).

Among the plurality of lower electrodes 162, a first line connecting the center points of a pair of most neighboring lower electrodes 162 in the first direction (Y direction) may have a first length L1 in the first direction (Y direction), and a second line connecting the center points of a pair of most neighboring lower electrodes 162 in an oblique direction crossing the first direction (Y direction) and the second direction (X direction) may have a second length L2 in the second direction (X direction). In this case, the first length L1 may be greater than the second length L2. In some example embodiments, when the first length L1 is about or exactly 3.0F, the second length L2 may be between about or exactly 2.4F and about or exactly 2.8F, between about or exactly 2.5F and about or exactly 2.7F, or about or exactly 2.6F.

The integrated circuit device 100 may include a support 171 for connecting the plurality of lower electrodes 162 from one another, to thereby support the plurality of lower electrodes 162. The support 171 may support upper portions of sidewalls of each lower electrode 162. The support 171 may support the plurality of lower electrodes 162 to prevent or reduce the plurality of lower electrodes 162 from collapsing and bending. For example, the support 171 may include an insulating material, for example, silicon oxide, silicon nitride, silicon oxynitride, and a combination thereof.

The support 171 may include a plurality of open areas OP and a plurality of support patterns SP. The plurality of open areas OP and the plurality of support patterns SP may be arranged according to a preset (or, alternatively, desired) rule. A single support pattern SP may be positioned around three lower electrodes 162 and support sidewalls of the three lower electrodes 162. A single opening area OP may be positioned around three lower electrodes 162 and open three lower electrodes 162. Herein, when the lower electrode 162 is "opened" in the opening area OP of the support 171, the support 171 is in such a structure that the dielectric layer is not yet formed. As the lower electrode 162 is covered by the dielectric layer 164 and the upper electrode 166 after forming the dielectric layer 164 and the upper electrode 166, the lower electrode 162 may not be exposed in the opening area OP of the support 171 in a final structure of the integrated circuit device 100.

The plurality of support patterns SP may be arranged in a honeycomb structure. The honeycomb structure of the plurality of support patterns SP may be substantially the same as or similar to the honeycomb structure of the plurality of lower electrodes 162 described above. In a plan view, the honeycomb structure of the plurality of support patterns SP may be defined by six support patterns SP positioned at six vertexes of a hexagon and by a single support pattern SP positioned at a center point of the hexagon. Thus, the plurality of support patterns SP may be arranged in such a configuration that a plurality of honeycomb structures continuously and partially overlap in the first direction (Y direction) and the second direction (X direction). That is, the support patterns SP positioned at six vertexes and the center point of the hexagon may be provided as a honeycomb structure, and each support pattern SP at the six vertexes of the hexagon may be provided as center points of other hexagons for other honeycomb structures, respectively. Among the plurality of support patterns SP, a line connecting the center points of a pair of most neighboring support patterns SP in the first direction (Y direction) may have a third length in the first direction (Y direction), and another line connecting the center points of a pair of most neighboring support patterns SP in an oblique direction crossing the first direction (Y direction) and the second direction (X direction) may have a fourth length in the second direction (X direction). In such a case, the third length may be equal to the first length L1, and the fourth length may be equal to the second length L2.

The plurality of open areas OP may be arranged in a honeycomb structure. The honeycomb structure of the plurality of open areas OP may be substantially the same as or similar to that of the plurality of lower electrodes 162, as described above. In a plan view, the honeycomb structure of the plurality of open areas OP may be defined by six open areas OP positioned at six vertexes of a hexagon and by a single opening area OP positioned at a center point of the hexagon. Thus, the plurality of open areas OP may be arranged in such a configuration that a plurality of honeycomb structures continuously and partially overlap in the first direction (Y direction) and the second direction (X direction). That is, the open areas OP positioned at six vertexes and the center point of the hexagon are provided as a honeycomb structure, and each opening area OP at six vertexes of the hexagon may be provided as center points of other hexagons for other honeycomb structures, respectively. Among the plurality of open areas OP, a line connecting the center points of a pair of most neighboring open areas OP in the first direction (Y direction) may have a fifth length in the first direction (Y direction), and another line connecting the center points of a pair of most neighboring opening area OP in an oblique direction crossing the first direction (Y direction) and the second direction (X direction) may have a sixth length in the second direction (X direction). In such a case, the fifth length may be equal to the first length L1, and the sixth length may be equal to the second length L2.

Figure 4A:
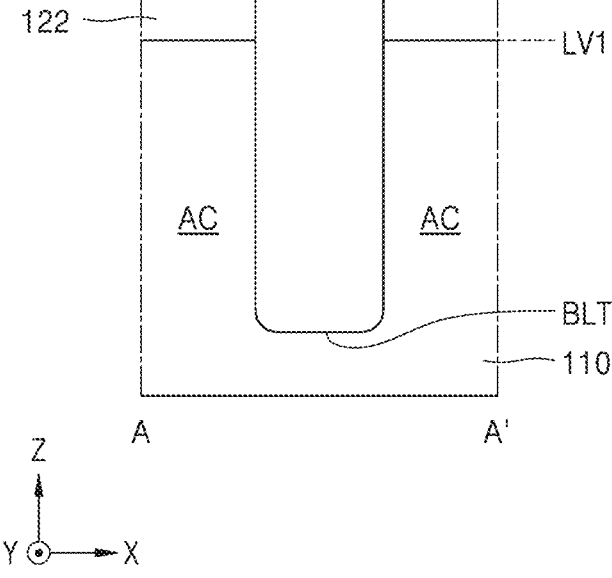
FIGS. 4A to 24B are views illustrating a method of manufacturing an integrated circuit device, according to some example embodiments in which FIG. 4A, FIG. 5A, . . . , FIG. 24A are cross-sectional views sequentially illustrating portions corresponding to the cross-sectional area cut along a line A-A' of FIG. 1 according to the process order, and FIG. 4B, FIG. 5B, . . . , FIG. 24B are cross-sectional views sequentially illustrating portions corresponding to the cross-sectional area cut along a line B-B' of FIG. 1 according to the process order.
Figure 4B:
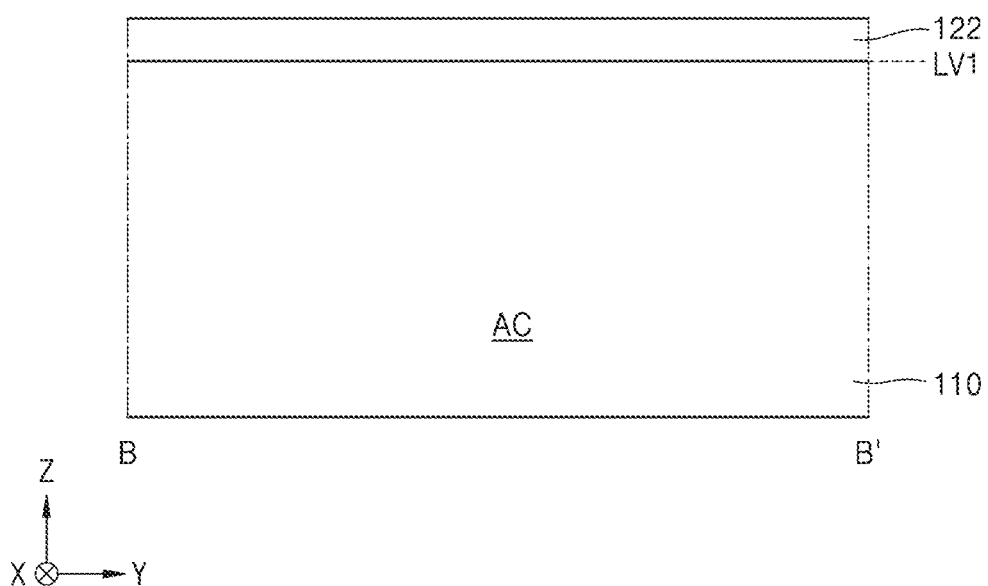
Figure 5A:
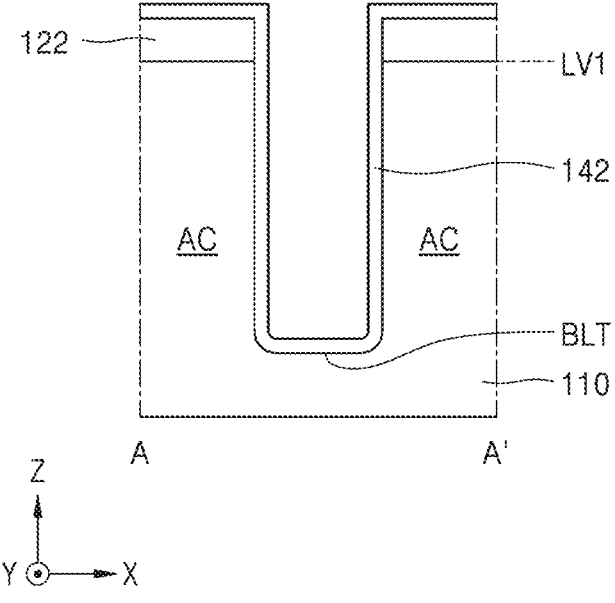
Figure 5B:
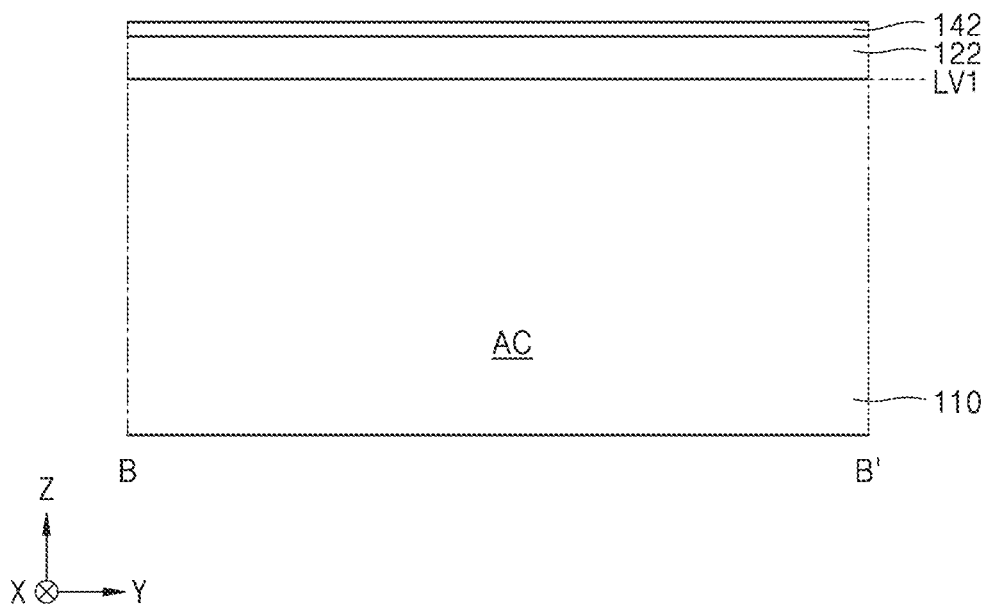
Figure 24A:
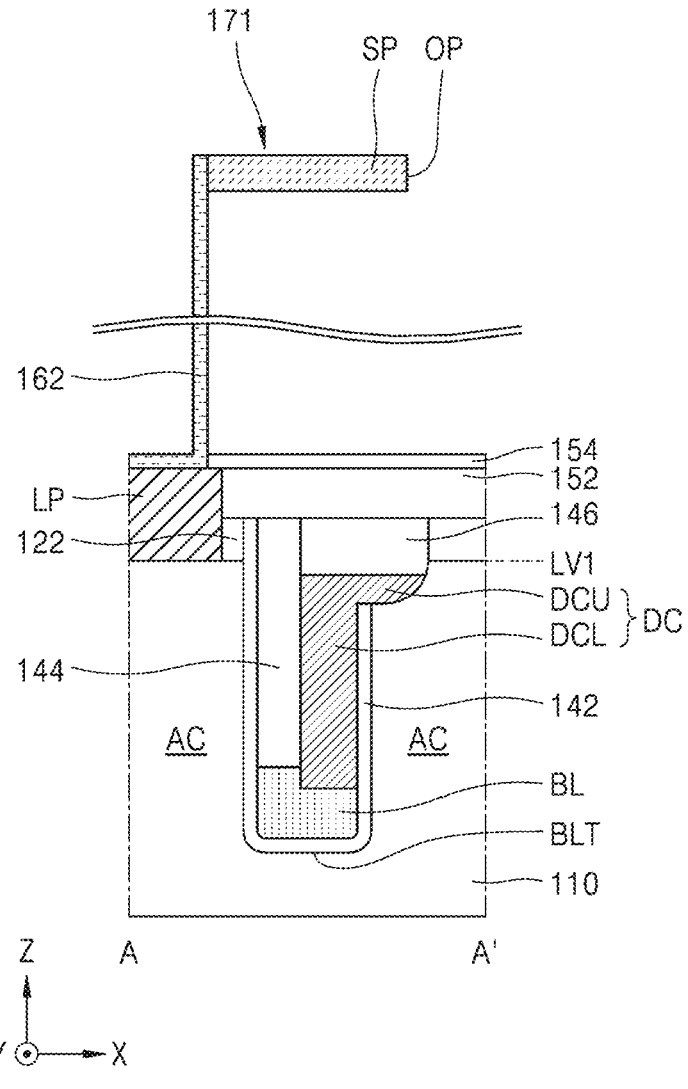
Figure 24B:
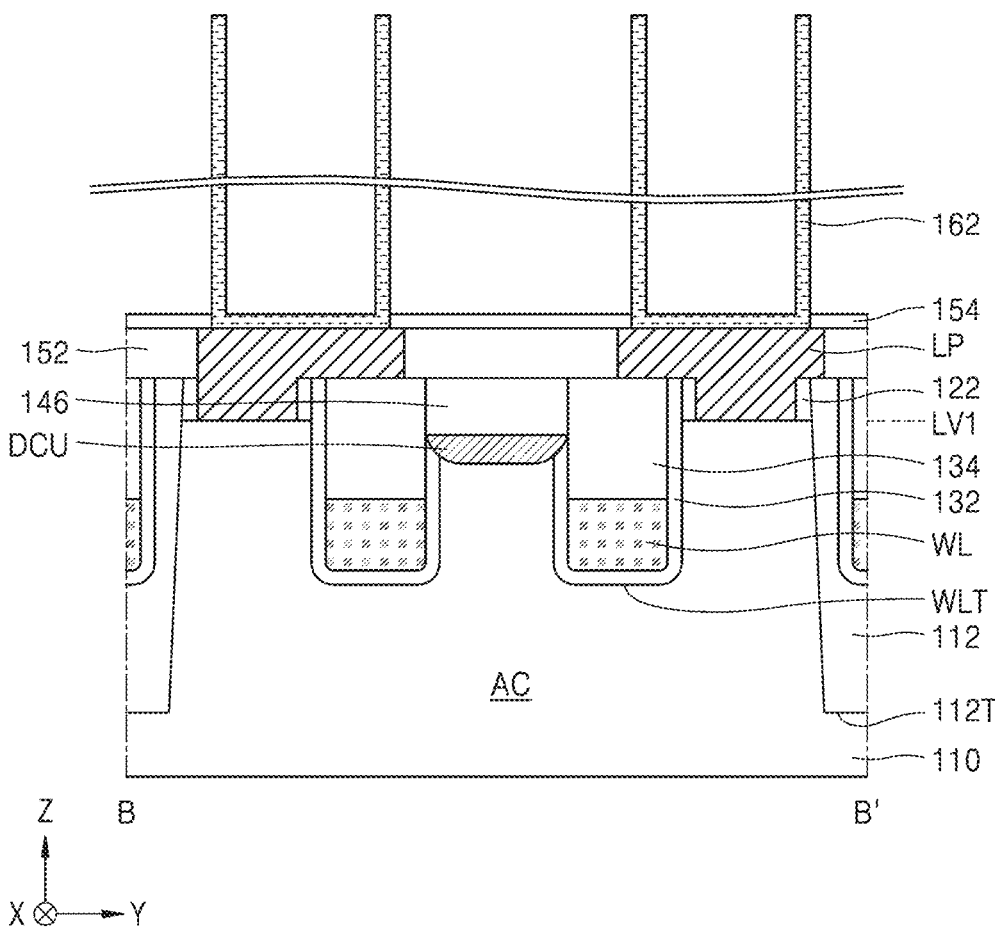

FIGS. 4A to 24B are views illustrating a method of manufacturing an integrated circuit device, according to some example embodiments. FIG. 4A, FIG. 5A, . . . , FIG. 24A are cross-sectional views sequentially illustrating portions corresponding to the cross-sectional area cut along a line A-A' of FIG. 1 according to the process order. FIG. 4B, FIG. 5B, . . . , FIG. 24B are cross-sectional views sequentially illustrating portions corresponding to the cross-sectional area cut along a line B-B' of FIG. 1 according to the process order.

Hereinafter, a method of manufacturing the integrated circuit device 100 illustrated in FIGS. 1 to 3 is described with reference to FIGS. 4A to 24B.

Referring to FIGS. 4A and 4B, a substrate 110 having a plurality of active areas AC may be prepared. The plurality of active areas AC may extend in the first direction (Y direction) in the substrate 110. Each active area AC may include source/drain regions that may be formed by an ion implantation process. Then, a first insulating layer 122 may be formed on the upper surface of the substrate 110. The first insulating layer 122 may include silicon oxide, silicon nitride, silicon oxynitride, or a combination thereof.

After forming the first insulating layer 122, a mask pattern (not shown) may be formed on the first insulating layer 122, and the first insulating layer 122 may be partially removed by an etching process using the mask pattern as an etching mask, and then, the substrate 110 may be partially removed by an etching process using the partially removed first insulating layer 122 as an etching mask. A bit line trench BLT may be formed in the substrate 110 by partially removing the substrate 110. The bit line trench BLT may extend downward from the upper surface of the substrate 110 and may extend in the first direction (Y direction) in the substrate 110. The bit line trench BLT may be positioned between two active areas AC adjacent to each other in the second direction (X direction).

Referring to FIGS. 5A and 5B, a bit line spacer 142 may be formed on an inner wall of the substrate 110 defining the bit line trench BLT and on an exposed surface of the first insulating layer 122. The bit line spacer 142 may conformally extend on the inner wall of the substrate 110 defining the bit line trench BLT and the exposed surface of the first insulating layer 122. In some example embodiments, the bit line spacer 142 may include silicon oxide, silicon nitride, silicon oxynitride, and/or a combination thereof.

Figure 6A:
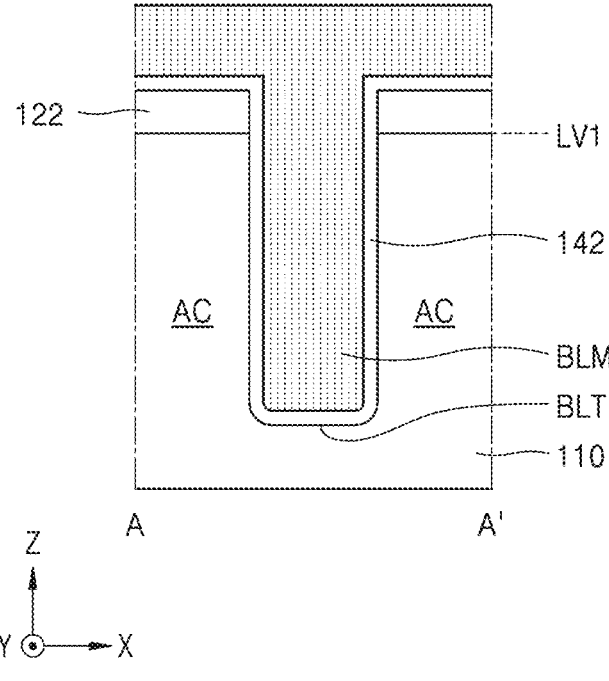
Figure 6B:
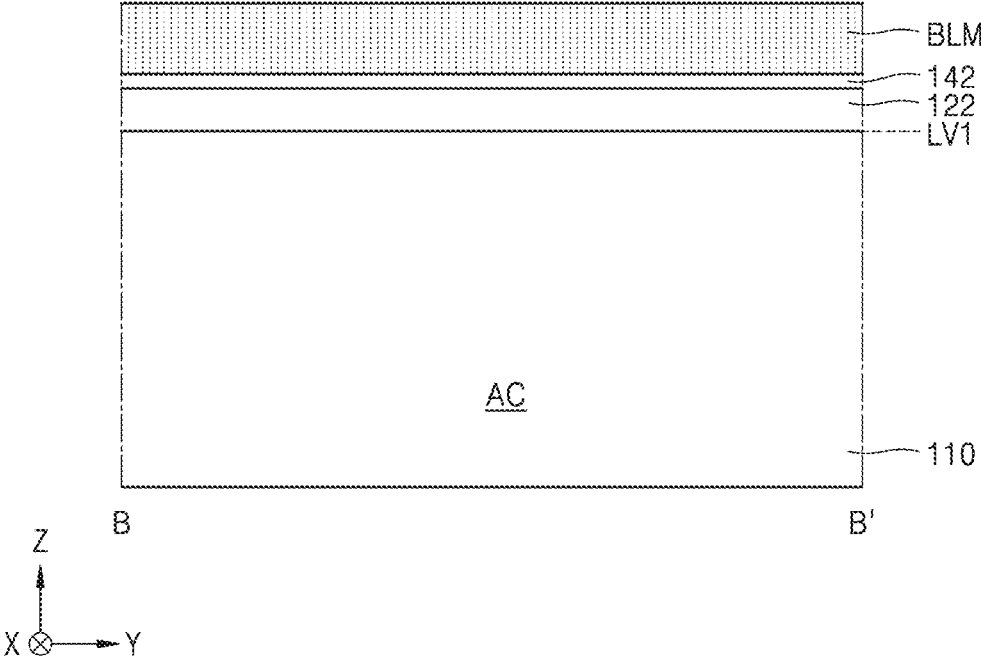

Referring to FIGS. 6A and 6B, a bit line conductive layer BLM may be formed on the bit line spacer 142. The bit line conductive layer BLM may be formed to fill the bit line trench BLT. For example, the bit line conductive layer BLM may include titanium (Ti), titanium nitride (TiN), tantalum (Ta), tantalum nitride (TaN), tungsten (W), tungsten nitride (WN), titanium silicon nitride (TiSiN), tungsten silicon nitride (WSiN), polysilicon, and/or a combination thereof.

Figure 7A:
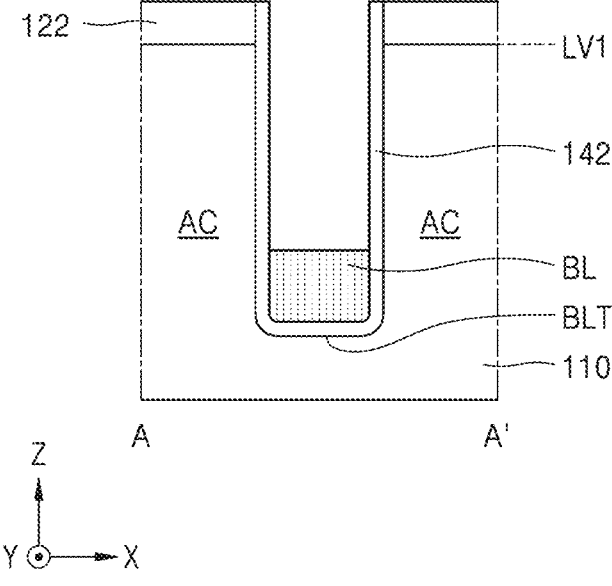
Figure 7B:
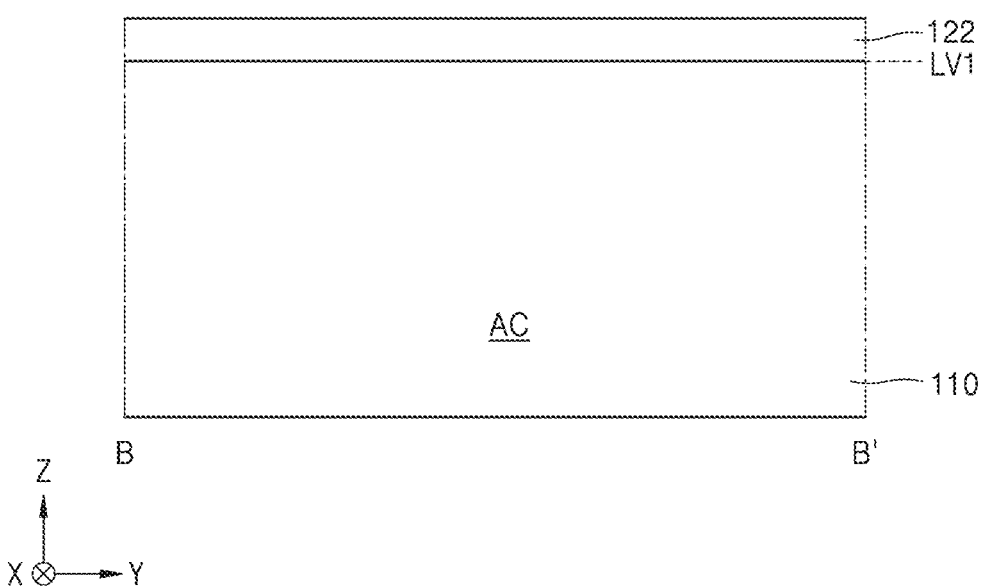

Referring to FIGS. 7A, and 7B, the bit line conductive layer BLM of FIGS. 6A and 6B may be partially removed, to thereby form a bit line BL partially filling the bit line trench BLT. For example, the removal of the bit line conductive layer BLM may be performed by an etch-back process, a chemical mechanical polishing (CMP) process, and/or a combination thereof. For example, when the bit line conductive layer BLM is partially removed by the etch-back process, the residuals (e.g., materials left behind, remnants from the removal) of the bit line conductive layer BLM may be formed into the bit line BL after the etch-back process. The bit line BL may fill a lower portion of the bit line trench BLT.

It is described above the ion implantation process for forming the source/drain regions in the plurality of active areas AC is performed prior to the operation of forming the bit line BL, but the inventive concepts are not limited thereto, and the ion implantation process for forming the source/drain regions in the plurality of active areas AC may be performed after the operation of forming the bit line BL.

Figure 8A:
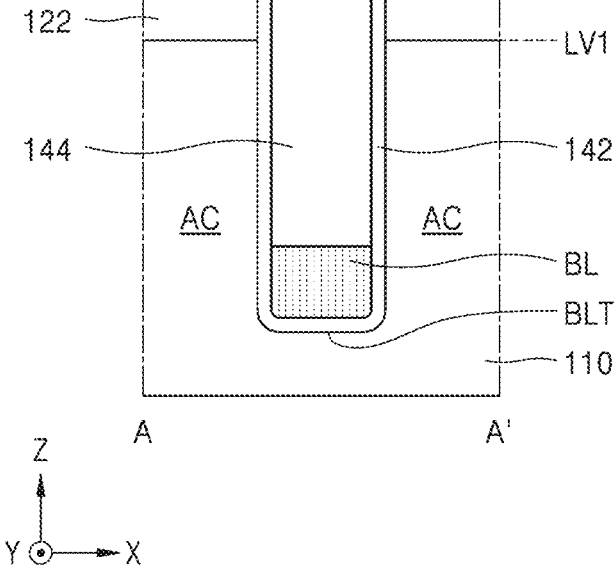
Figure 8B:
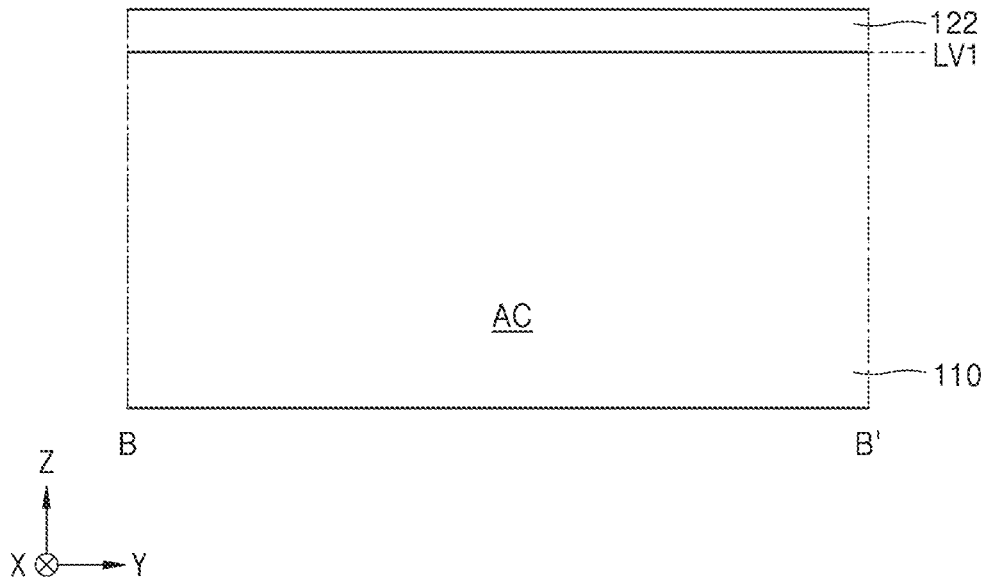

Referring to FIGS. 8A and 8B, a bit line capping insulation layer 144 may be formed to fill up the bit line trench BLT. The bit line capping insulation layer 144 may be formed to cover the bit line BL that is positioned at the lower portion of the bit line trench BLT. For example, a pre-capping insulating layer may be formed on the first insulating layer 122 until the bit line trench BLT is filled up, and then the pre-capping insulating layer may be planarized until the first insulating layer 122 is exposed, to thereby form the bit line capping insulation layer 144.

Figure 9A:
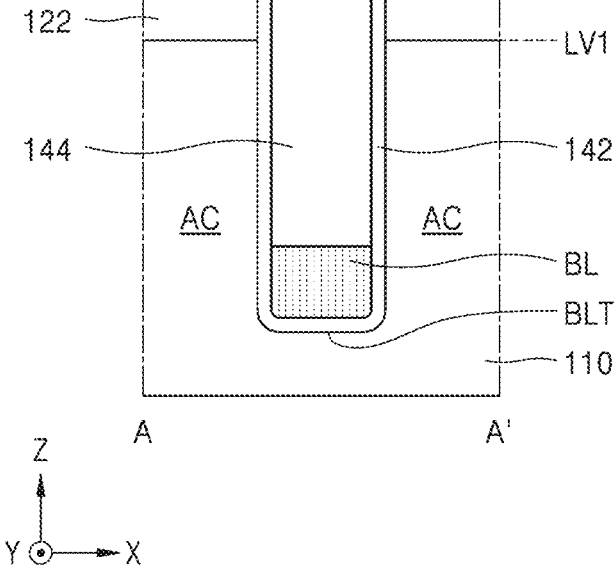
Figure 9B:
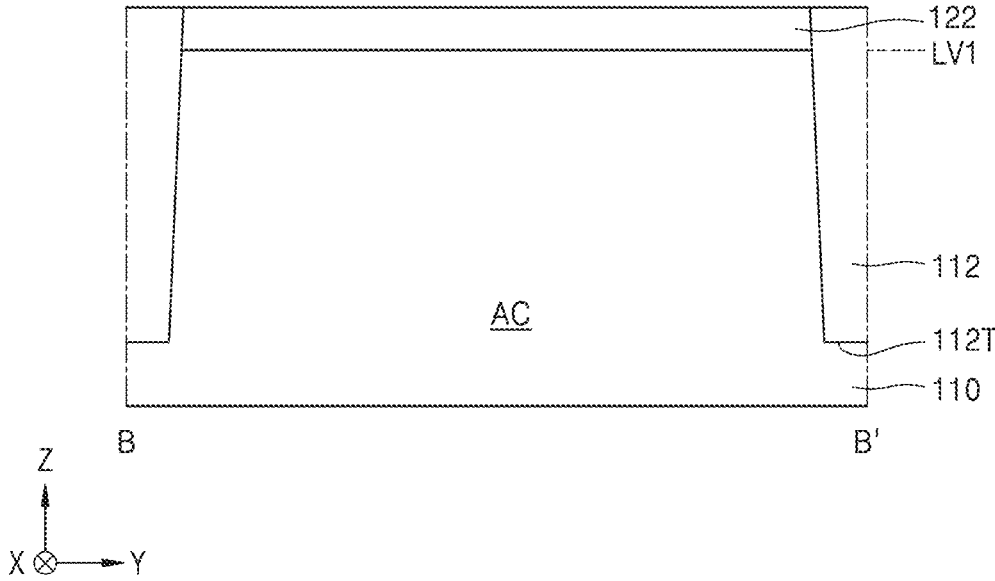

Referring to FIGS. 9A and 9B, a plurality of device isolation trenches 112T may be formed in the substrate 110, and an isolation material may be filled into the plurality of device isolation trenches 112T, to thereby form a device isolation layer 112. For example, the device isolation layer 112 may include an oxide layer, a nitride layer, and a combination thereof. A single device isolation layer 112 may be positioned between two active areas AC adjacent to each other in the first direction (Y direction), and a single active area AC may be defined by two device isolation layers 112 spaced apart in the first direction (Y direction).

Figure 10A:
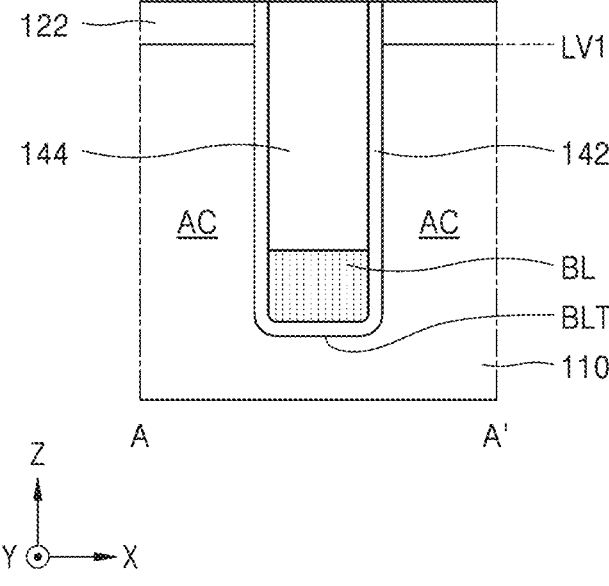
Figure 10B:
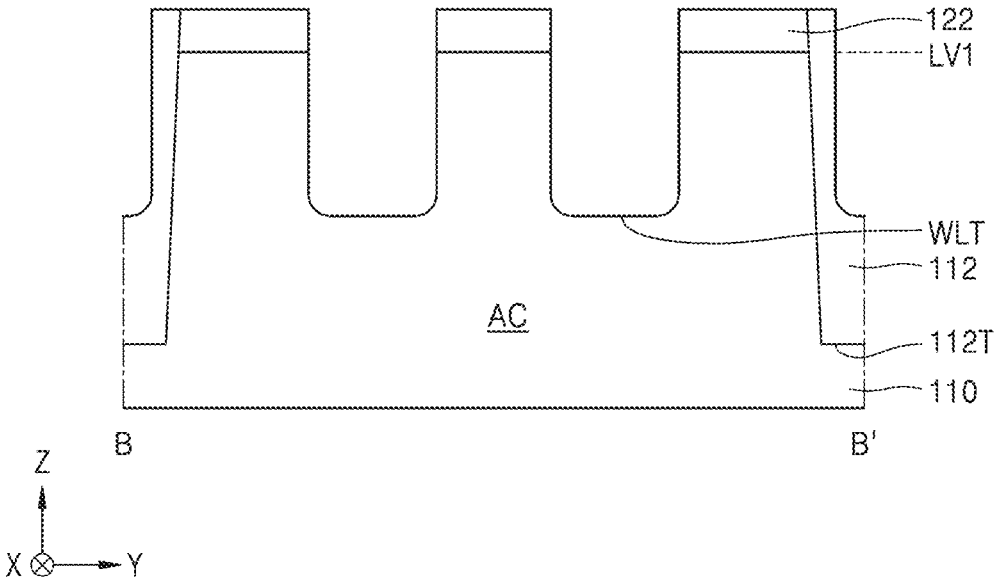

Referring to FIGS. 10A and 10B, the substrate 110 may be further partially removed, and a plurality of word line trenches WLT may be formed in the substrate 110. For example, in order to form the word line trench WLT, forming a mask pattern (not shown) on the first insulating layer 122, removing a portion of the first insulating layer 122 exposed through openings of the mask pattern, and removing a portion of the substrate 110 exposed after removal of a portion of the first insulating layer 122 may be sequentially performed. The plurality of word line trenches WLT may extend downward from the upper surface of the substrate 110 and may extend in the second direction (X direction) in the substrate 110.

When the word line trench WLT is formed to have a first depth from the upper surface of the substrate 110, the bit line trench BLT may have a second depth greater than the first depth from the upper surface of the substrate 110. That is, the distance between the upper surface of the substrate 110 and the bottom of the bit line trench BLT in the vertical direction (Z direction) may be greater than the distance between the upper surface of the substrate 110 and the bottom of the word line trench WLT in the vertical direction (Z direction). In some example embodiments, some of the plurality of word line trenches WLT may be formed in the device isolation layer 112.

Figure 11A:
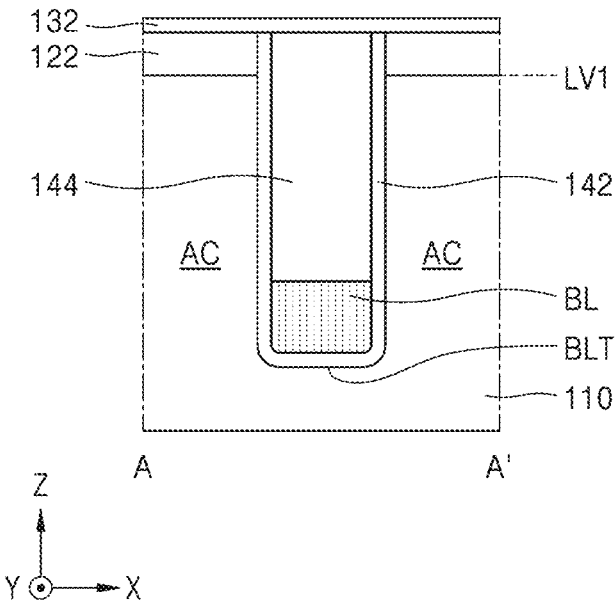
Figure 11B:
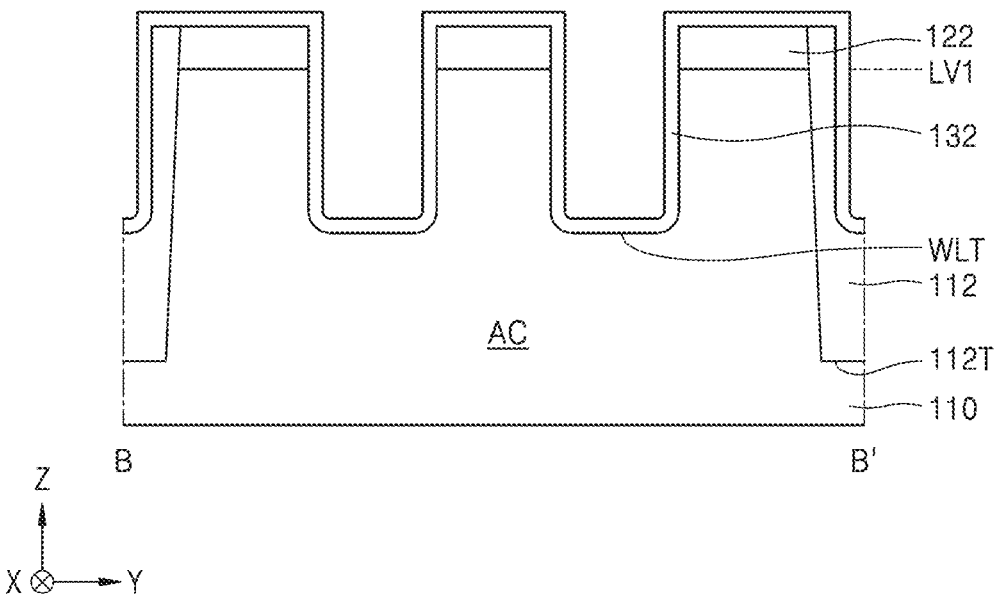

Referring to FIGS. 11A and 11B, word line spacers 132 may be formed on an inner wall of the substrate 110 defining the word line trench WLT and on an exposed surface of the first insulating layer 122. The word line spacer 132 may conformally extend on the inner wall of the substrate 110 defining the word line trench WLT and the exposed surface of the first insulating layer 122. In some example embodiments, the word line spacer 132 may include a silicon oxide layer, a silicon nitride layer, a silicon oxynitride layer, an ONO layer, and/or a high-k dielectric layer having a higher dielectric constant than silicon oxide.

Figure 12A:
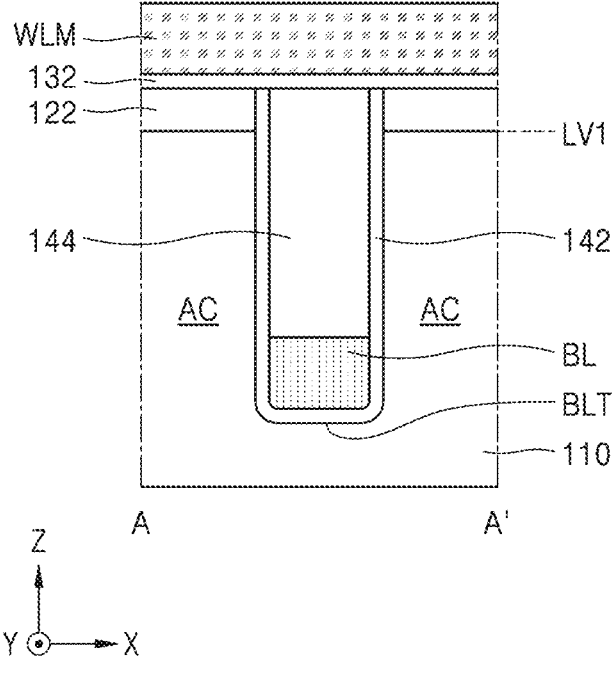
Figure 12B:
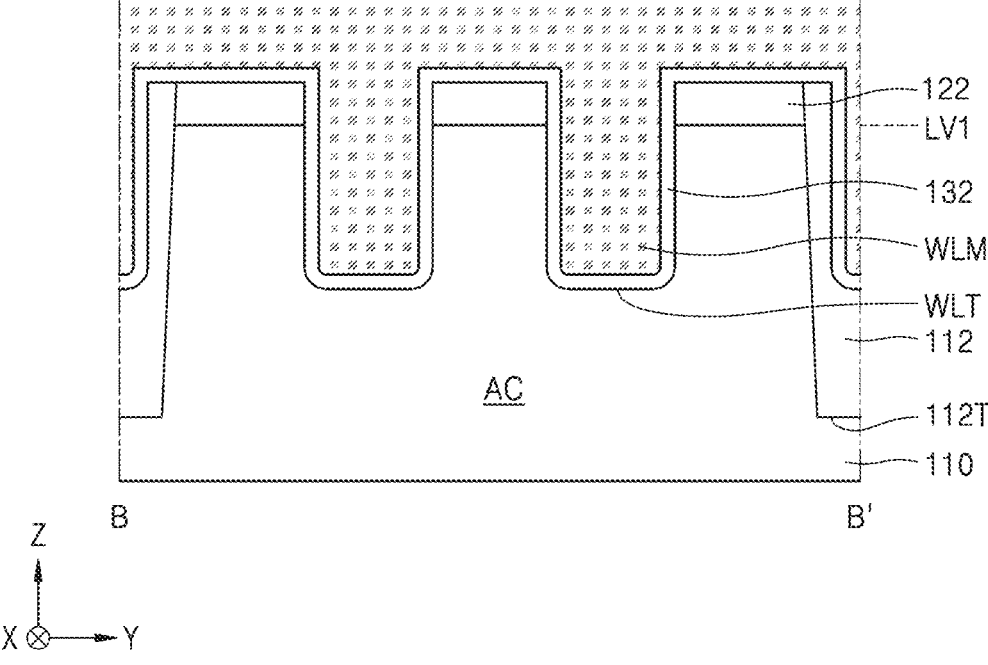

Referring to FIGS. 12A and 12B, a word line conductive layer WLM may be formed on the word line spacer 132. The word line conductive layer WLM may be formed to fill up the word line trench WLT. For example, the word line conductive layer WLM may include titanium (Ti), titanium nitride (TiN), tantalum (Ta), tantalum nitride (TaN), tungsten (W), tungsten nitride (WN), titanium silicon nitride (TiSiN), tungsten silicon nitride (WSiN), polysilicon, and/or a combination thereof.

Figure 13A:
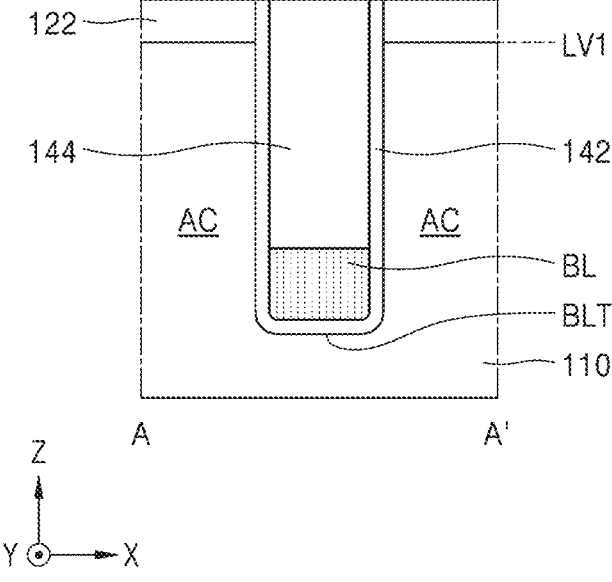
Figure 13B:
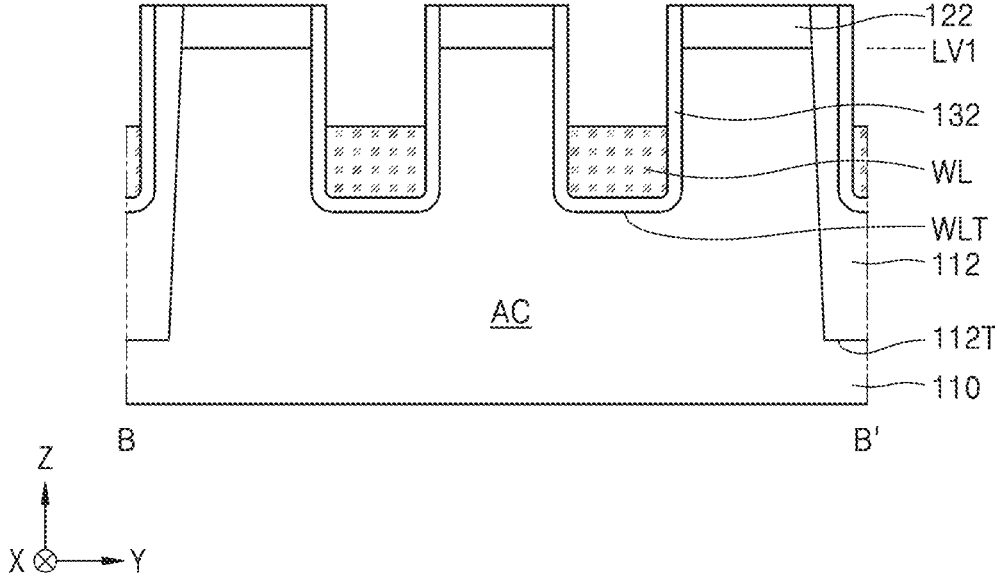

Referring to FIGS. 13A, and 13B, the word line conductive layer WLM and word line spacer 132 of FIGS. 12A and 12B may be partially removed until the first insulating layer 122 is exposed, to thereby form a word line WL filling a portion of the word line trench WLT. For example, the removal of the word line conductive layer WLM may be performed by an etch-back process, a chemical mechanical polishing (CMP) process, and a combination thereof. For example, when the word line conductive layer WLM is partially removed by the etch-back process, the residuals of the word line conductive layer WLM may be formed into the word line WL after the etch-back process. The word line WL may fill a lower portion of the word line trench WLT.

Figure 14A:
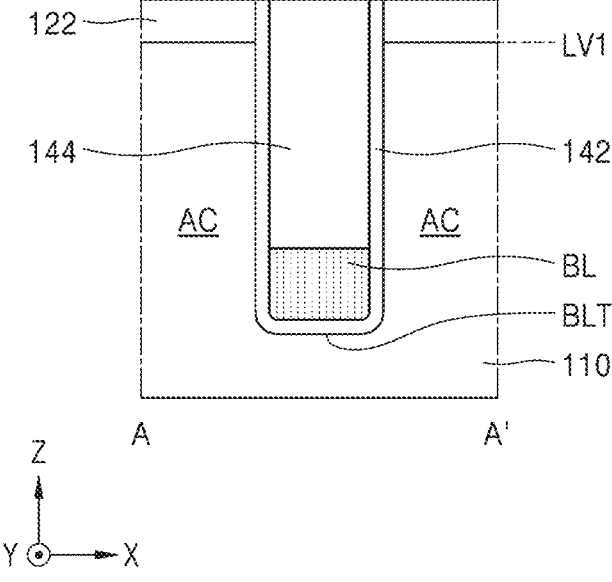
Figure 14B:
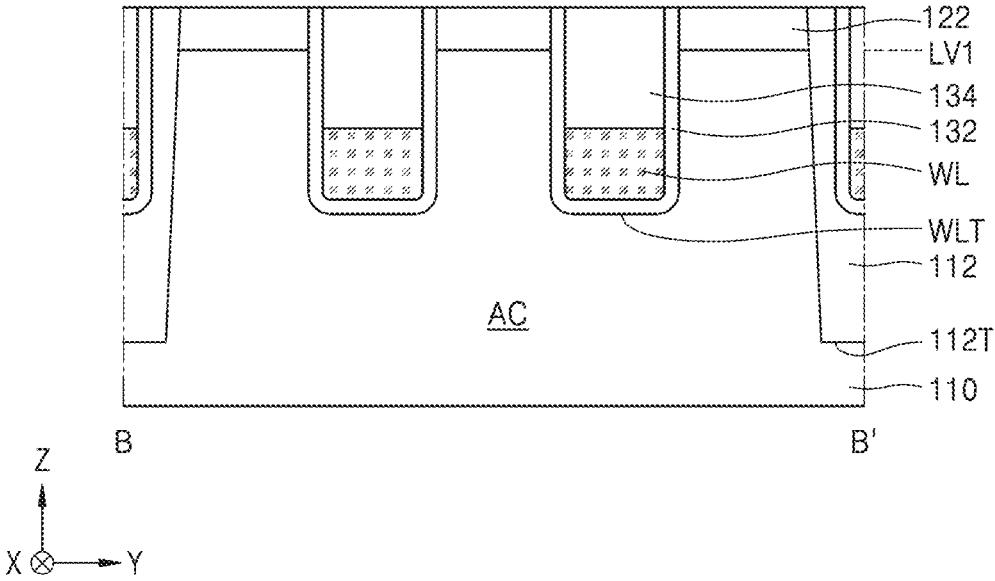

Referring to FIGS. 14A and 14B, a word line capping insulation layer 134 may be formed to fill up the word line trench WLT. The word line capping insulation layer 134 may be formed to cover the word line WL that is positioned at the lower portion of the word line trench WLT. For example, a pre-capping insulation layer (not shown) may be formed on the first insulating layer 122 until the word line trench WLT is filled up, and then the pre-capping insulation layer may be planarized until the first insulating layer 122 is exposed, to thereby form the word line capping insulation layer 134. For example, the word line capping insulation layer 134 may include silicon nitride.

Figure 15A:
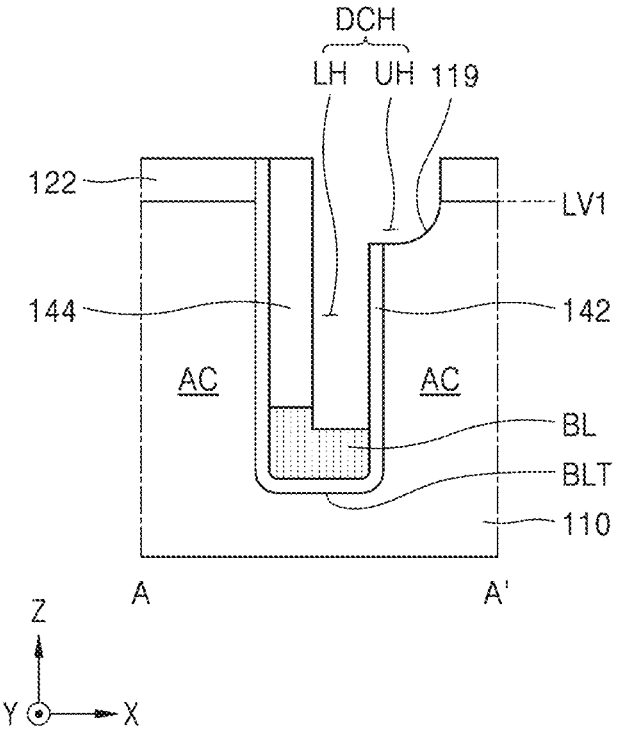
Figure 15B:
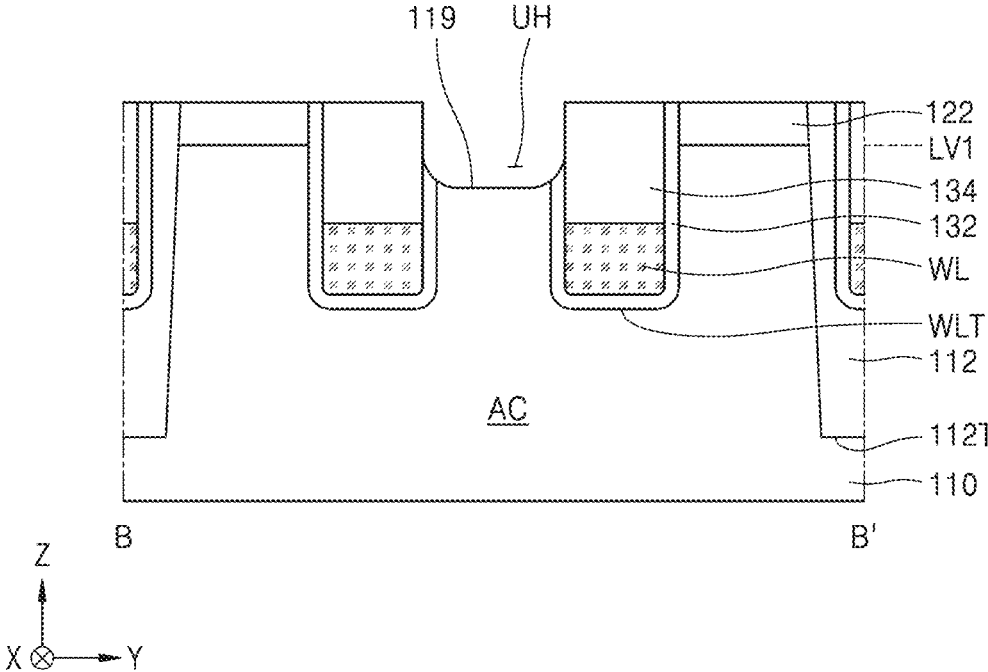

Referring to FIGS. 15A and 15B, the bit line capping insulation layer 144, the bit line spacer 142, and the substrate 110 may be partially removed, to thereby form a contact hole DCH through which the bit line BL is exposed. The contact hole DCH may include a lower hole LH and an upper hole UH communicating (e.g., exposed) with each other.

The lower hole LH may extend from an upper surface of the bit line BL along the bit line spacer 142 in the vertical direction (Z direction) and may at least partially expose the upper surface of the bit line BL. In a plan view, the lower hole LH may vertically overlap the bit line BL.

The upper hole UH may expose an upper portion of the active area AC that is arranged on one side of the bit line BL.

In a plan view, one portion of the upper hole UH may vertically overlap a single bit line BL, and the other portion of the upper hole UH may vertically overlap a single active area AC. A horizontal width of the upper hole UH may be greater than a horizontal width of the lower hole LH in the second direction (X direction). The upper hole UH may be defined by a recessed surface 119 of the substrate 110 that is formed by removal of a portion of the substrate 110.

For example, the contact hole (DCH) may be formed by sequentially performing an etching process for removing a portion of the bit line capping insulation layer 144 to thereby expose the bit line BL, an etching process for removing an upper portion of the bit line spacer 142, and an etching process for removing an upper portion of the active area AC that is on a side of the bit line BL. In some example embodiments, the contact hole DCH may be formed by a self-aligned contact etching process. A portion of the bit line spacer 142 may be exposed through the contact hole DCH, and the lower hole LH may extend along the exposed bit line spacer 142. The bit line spacer 142 may include a material having an etch selectivity with respect to the bit line capping insulation layer 144.

Figure 16A:
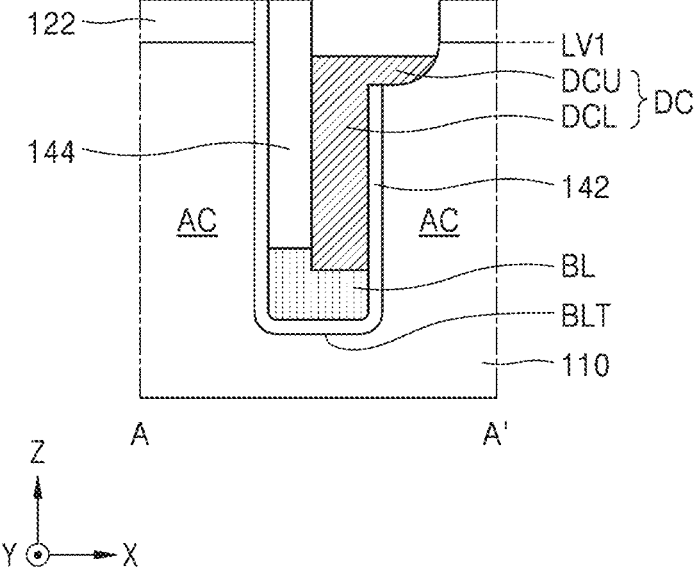
Figure 16B:
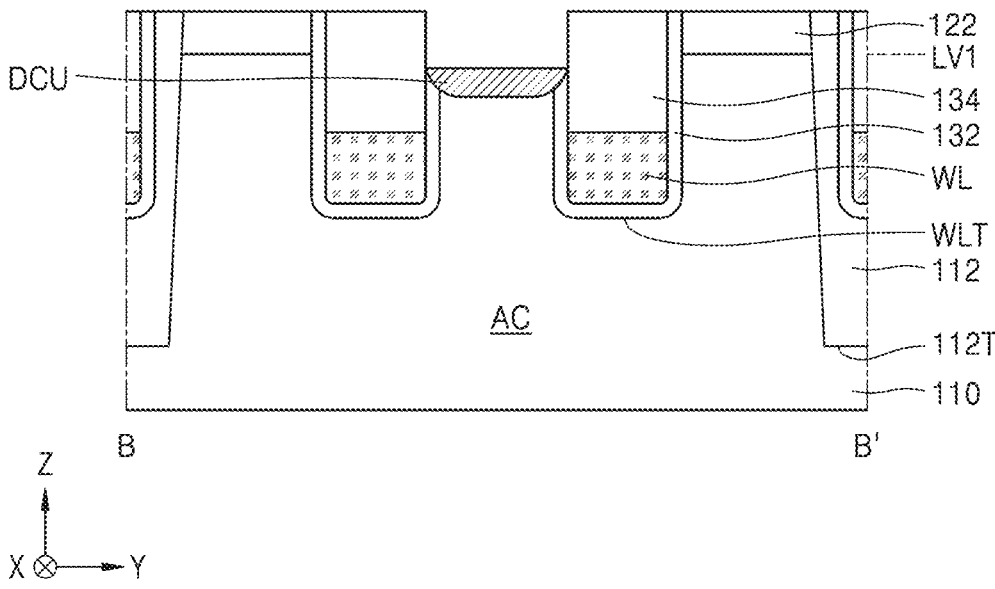

Referring to FIGS. 16A, and 16B, a bit line contact structure DC may be formed to fill in the contact hole DCH of FIGS. 15A and 15B. The bit line contact structure DC may include a lower contact DCL filling the lower hole LH and an upper contact DCU at least partially filling the upper hole UH. For example, a conductive layer may be formed to fill in the contact hole DCH, and then, the conductive layer may be partially removed by an etch-back process, to thereby form the bit line contact structure DC in at least a portion of the contact hole DCH. The bit line spacer 142 may function as a guide for forming the lower contact DCL in the process for forming the bit line contact structure DC. In some example embodiments, the vertical level of the upper surface of the bit line contact structure DC may be equal to or lower than the vertical level LV1 of the upper surface of the substrate 110.

Figure 17A:
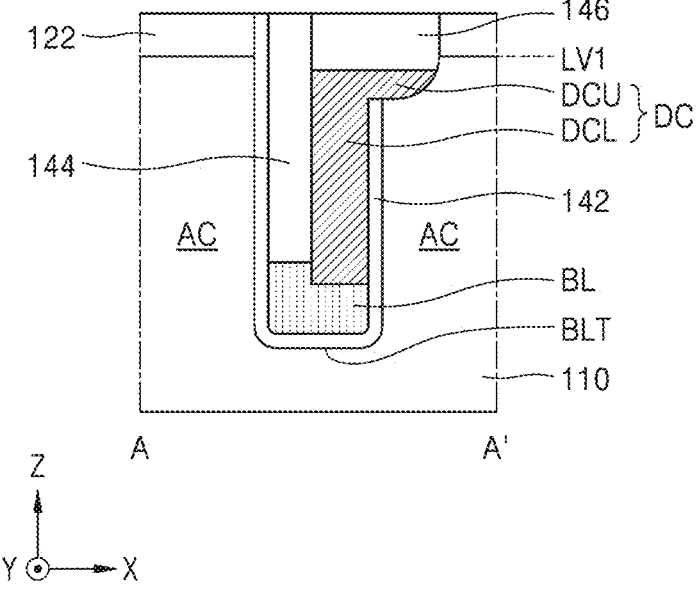
Figure 17B:
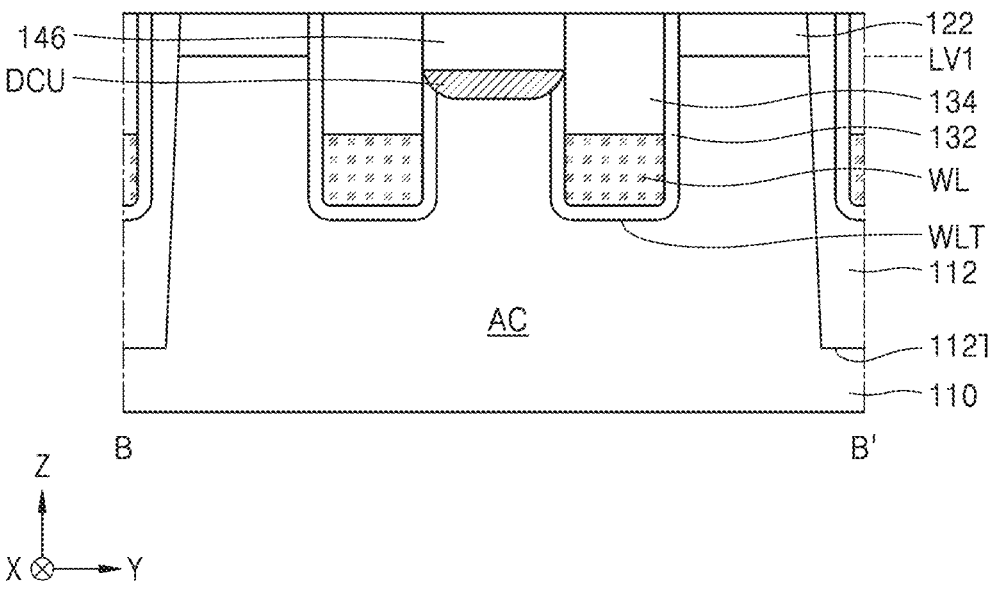

Referring to FIGS. 17A and 17B, a contact cover insulating layer 146 may be formed on the bit line contact structure DC, and the bit line contact structure DC may be covered by the contact cover insulating layer 146. The contact cover insulating layer 146 may be formed to fill a hole of the first insulating layer 122 vertically overlapping the bit line contact structure DC. For example, the contact cover insulating layer 146 may include silicon nitride.

Figure 18A:
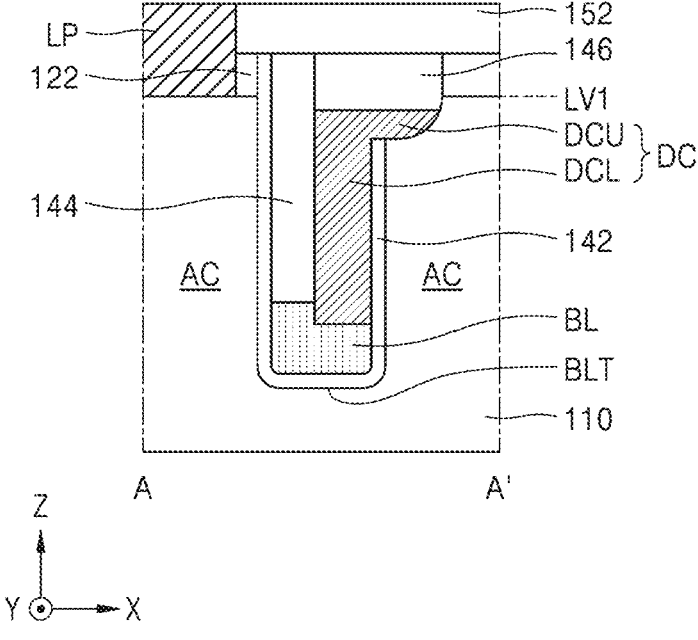
Figure 18B:
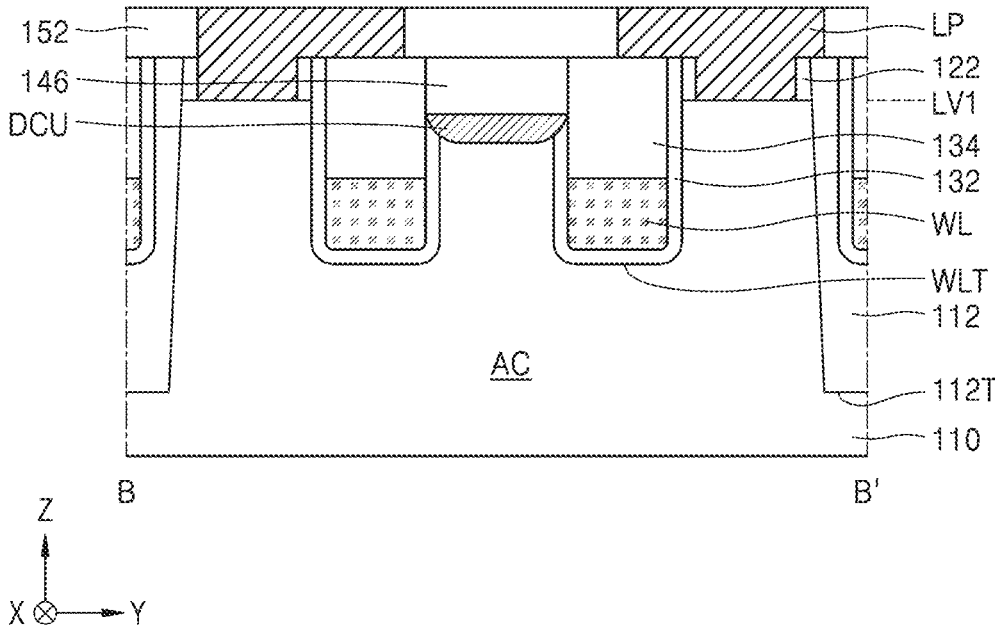

Referring to FIGS. 18A and 18B, the first insulating layer 122 may be partially removed to thereby form a hole through which the upper surface of the substrate 110 is partially exposed, and a landing pad conductive layer may be formed on the exposed upper surface of the substrate 110 and the first insulating layer 122. Then, the landing pad conductive layer may be patterned to form a plurality of landing pads LP shaped into an island pattern. The landing pad LP may make contact with the active area AC that is on a side of the word line WL. As the plurality of landing pads LP are formed into the island pattern, an insulating space may be formed around the plurality of landing pads LP. An insulating pattern 152 may be formed in the insulating space around the plurality of landing pads LP.

Figure 19A:
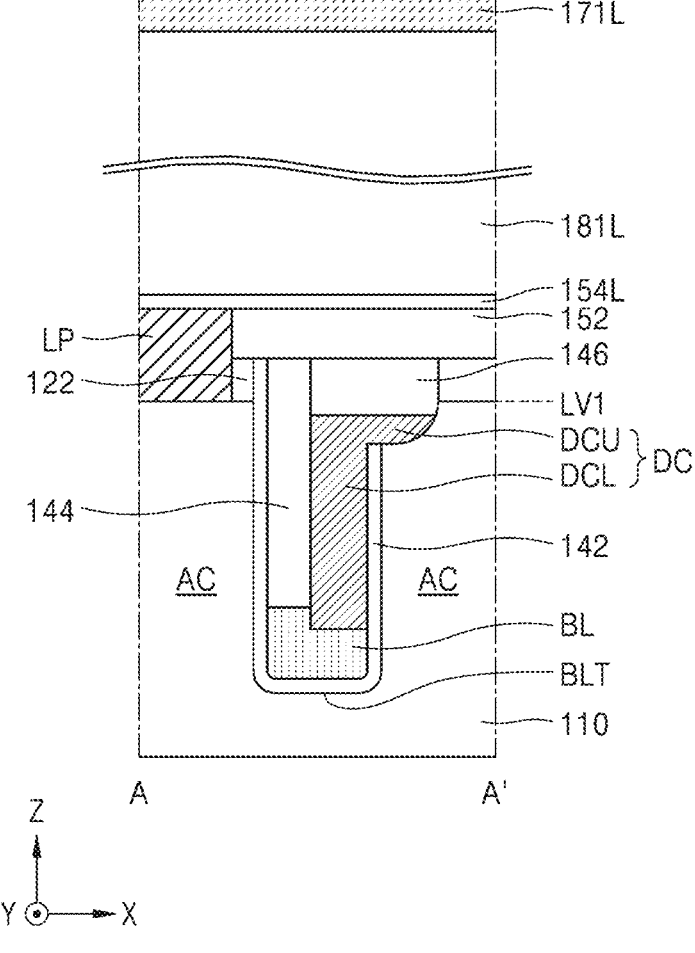
Figure 19B:
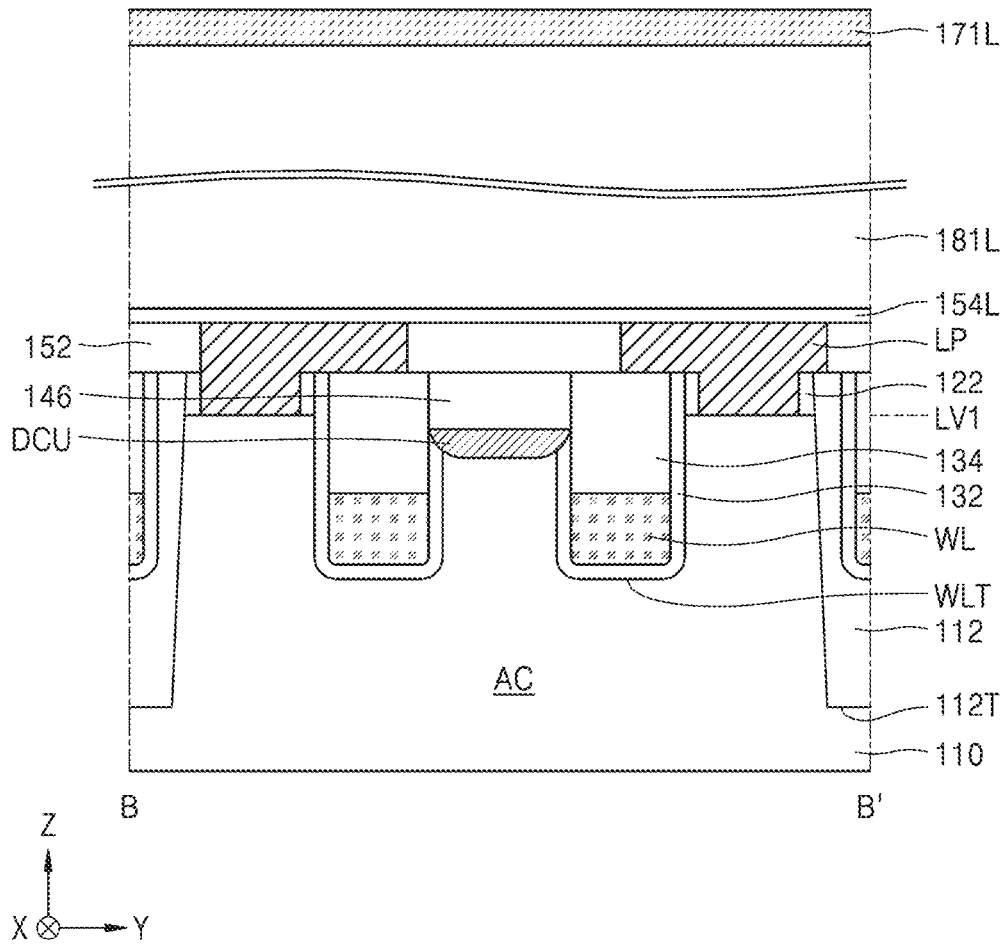

Referring to FIGS. 19A and 19B, an etch stop layer 154L may be formed on the landing pads LP and the insulating pattern 152, and a mold layer 181L may be formed on the etch stop layer 154L. The mold layer 181L may include silicon oxide. For example, the mold layer 181L may include borophosphorous silicate glass (BPSG), spin-on dielectrics (SOD), phosphorous silicate glass (PSG), low pressure tetra ethyl ortho silicate (LPTEOS), and/or plasma enhanced tetra ethyl ortho silicate (PE-TEOS). Subsequently, a support formation layer 171L may be formed on the mold layer 181L. For example, the support formation layer 171L may include a material such as silicon nitride and/or polysilicon.

Referring to FIGS. 19A, 19B, 20A, and 20B, the support formation layer 171L and the mold layer 181L may be partially removed to thereby form a hole H1 through which the landing pad LP is exposed. The hole H1 may be smaller in the first and second horizontal directions than a respective landing pad LP on which the hole H1 is formed. For example, a mask pattern may be formed on the support formation layer 171L, and the support formation layer 171L, mold layer 181L, and the etch stop layer 154L, which are stacked under the mask pattern and overlaps openings of the mask pattern, may be sequentially and partially etched away by an etching process using the mask pattern as an etching mask. By the etching process, the support formation layer 171L, the mold layer 181L, and the etch stop layer 154L may be formed into a support pattern layer 171P, a mold pattern 181P, and an etch stop pattern 154, respectively.

Figure 20A:
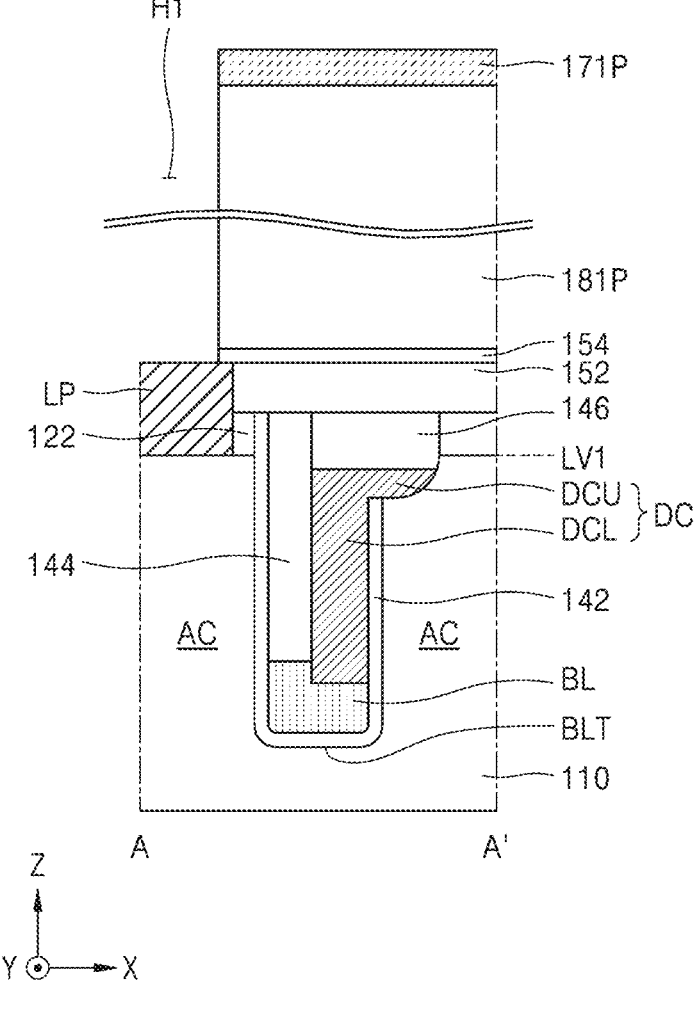
Figure 20B:
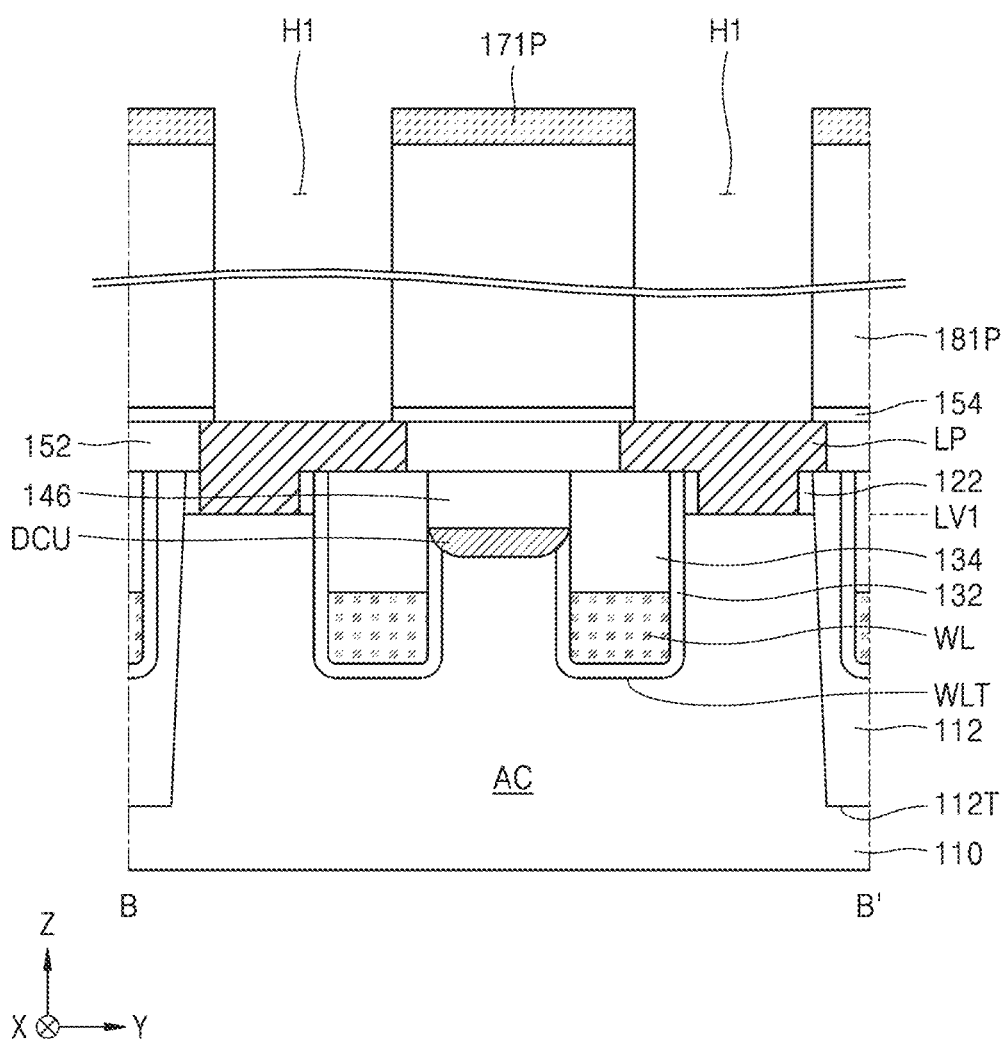
Figure 21A:
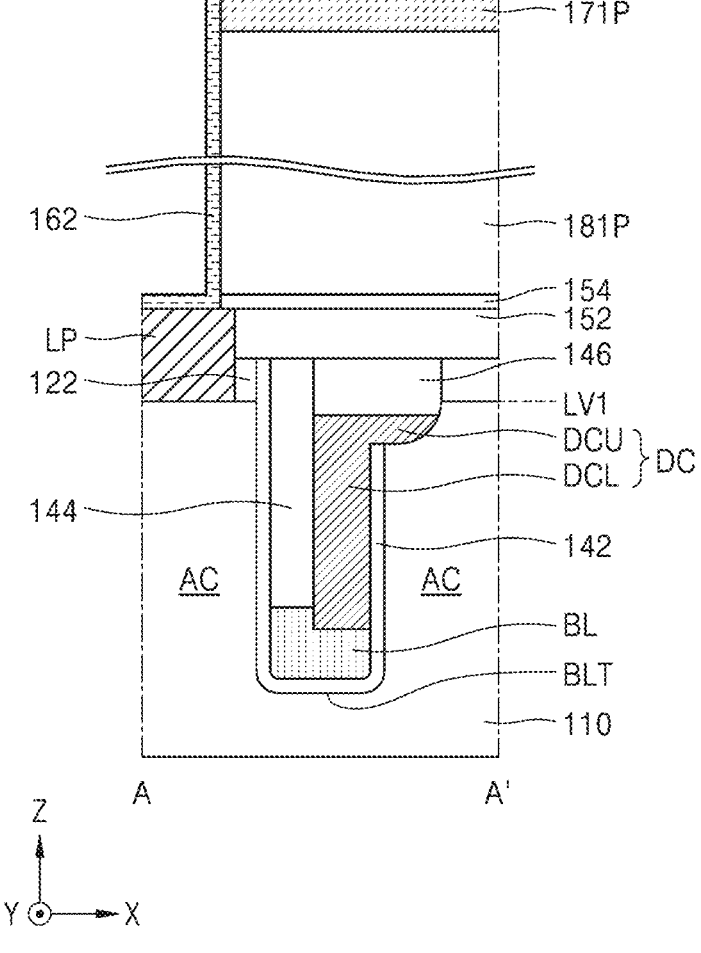
Figure 21B:
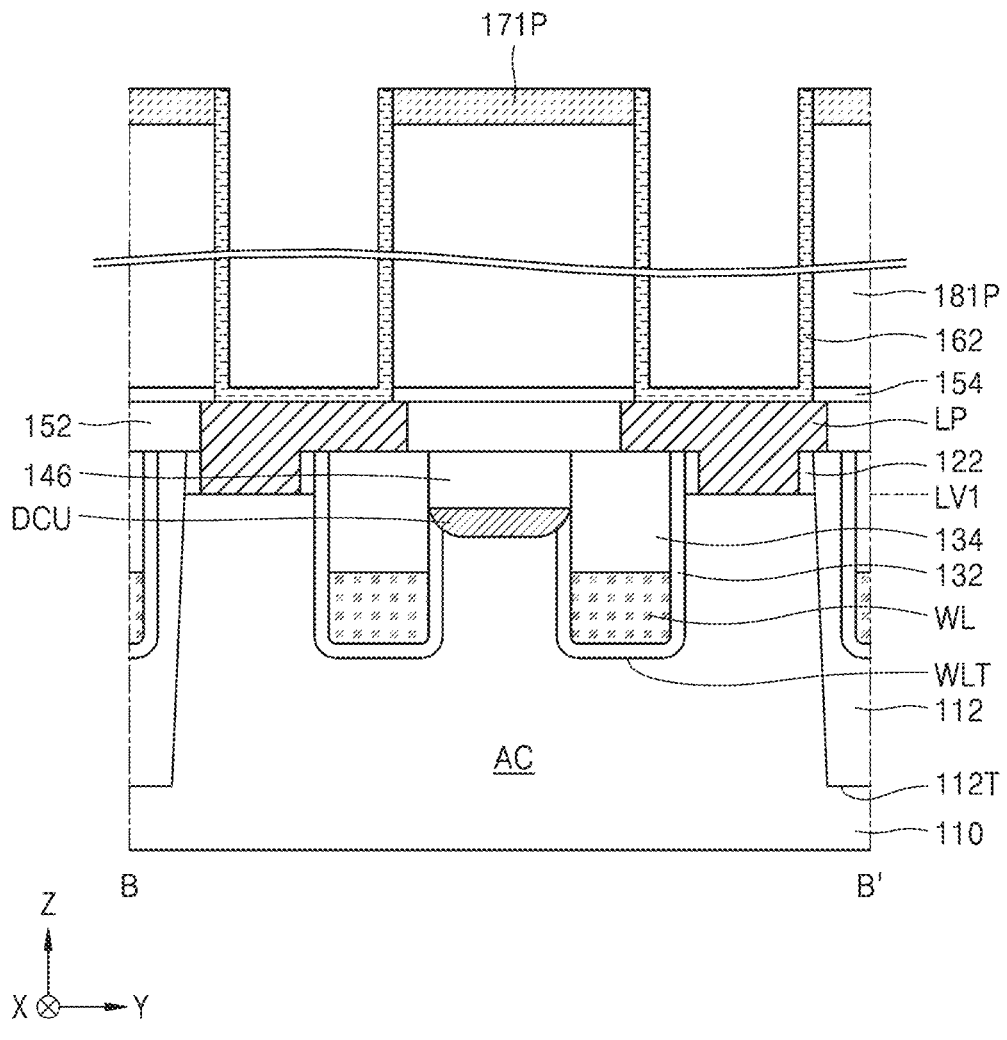

Referring to FIGS. 21A and 21B, the lower electrode 162 may be formed to conformally extend along a surface of the landing pad LP, a side surface of the mold pattern 181P, and a side of the support pattern layer 171P that are exposed through the hole H1 in FIGS. 20A and 20B. For example, after forming a conductive layer covering result structure shown in FIGS. 20A and 20B, a node separation process may be performed to the conductive layer, to thereby form the lower electrode 162 shaped into a cylinder. The conductive layer for forming the lower electrode 162 may be formed by a chemical vapor deposition (CVD) process or an atomic layer deposition (ALD) process. The node separation process may include an etch-back process, a chemical mechanical polishing (CMP) process, and/or a combination thereof. The lower electrode 162 may include any one of a metal nitride, a metal, and a combination thereof. For example, the lower electrode 162 may include at least any one material selected from titanium nitride (TiN), ruthenium (Ru), tantalum nitride (TaN), tungsten nitride (WN), platinum (Pt), and/or iridium (Jr).

Figure 22A:
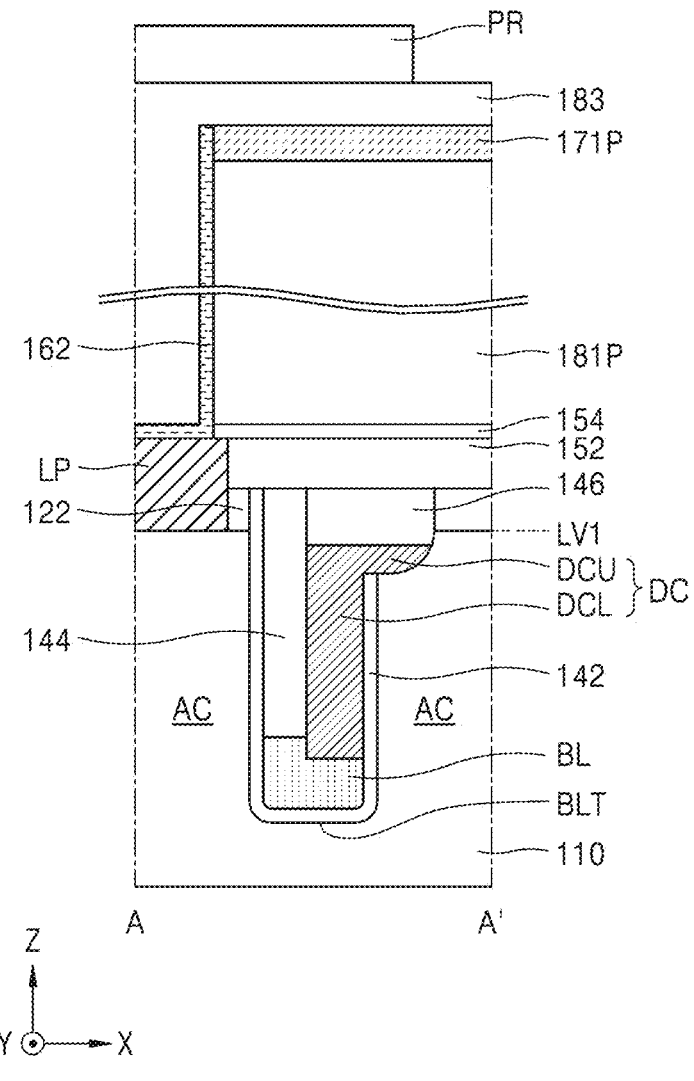
Figure 22B:
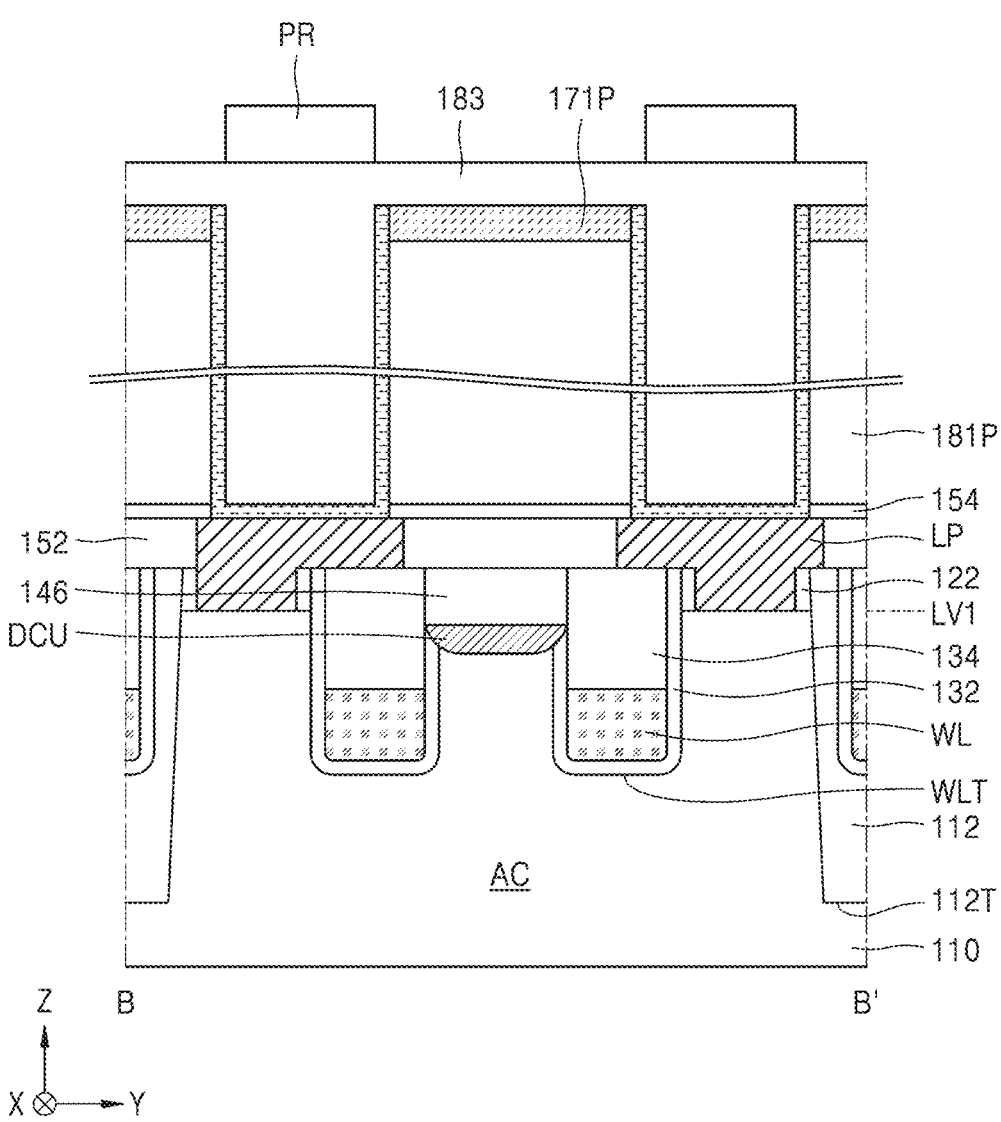
Figure 23A:
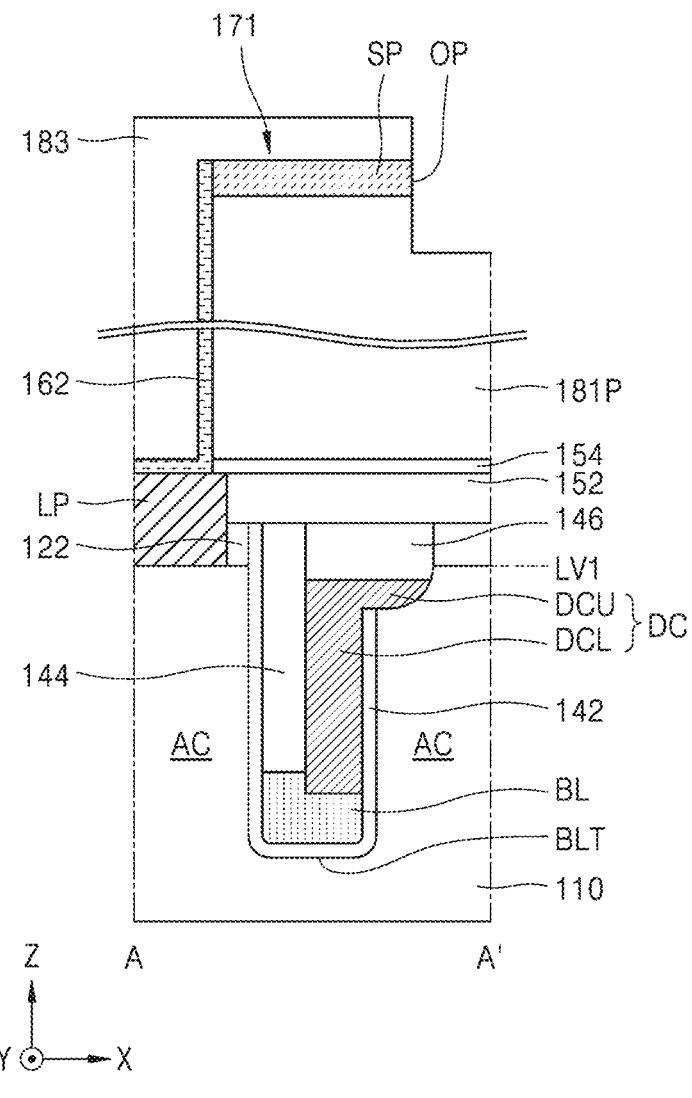
Figure 23B:
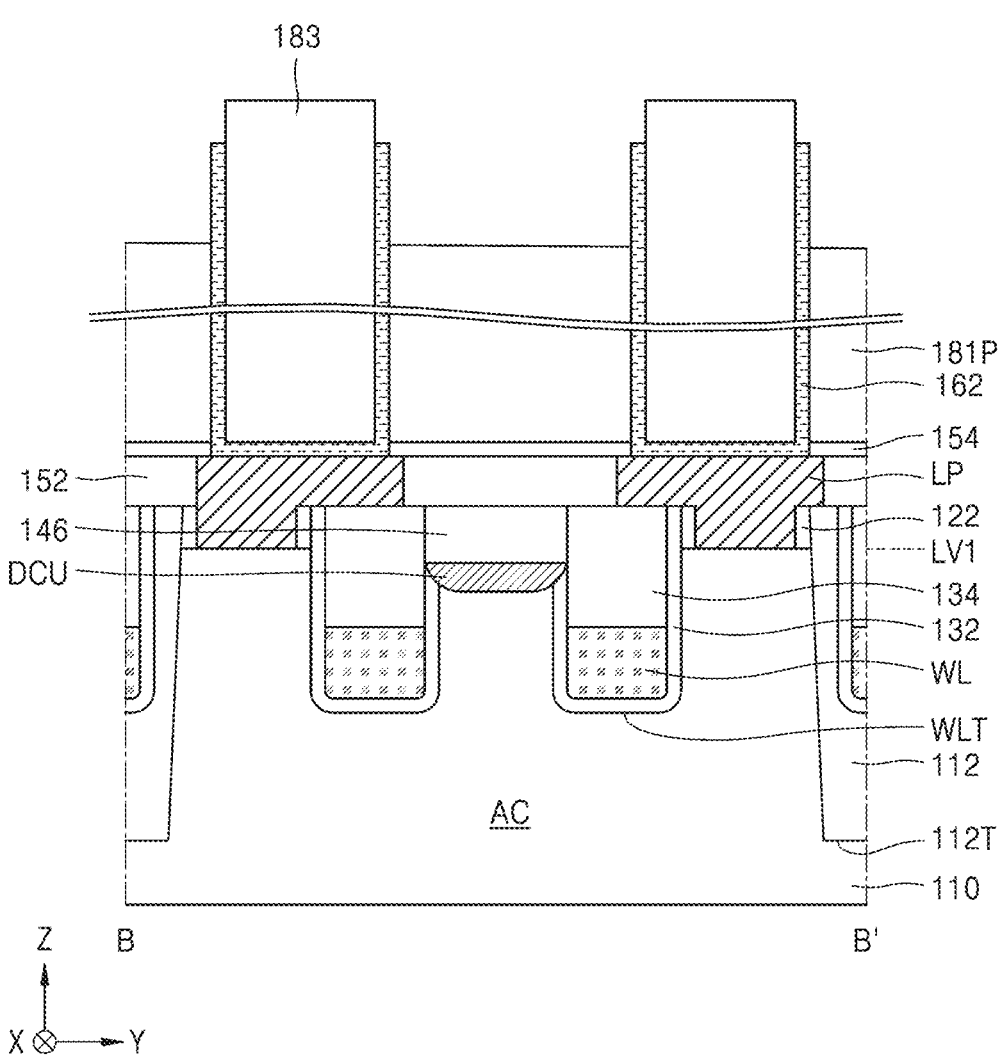

Referring to FIGS. 22A and 22B, a sacrificial layer 183 may be formed to cover the lower electrode 162 and the support pattern layer 171P. The sacrificial layer 183 may include silicon oxide, silicon nitride, silicon oxynitride, polysilicon, and/or the like. Thereafter, a photoresist pattern PR may be formed on the sacrificial layer 183.

Referring to FIGS. 22A, 22B, 23A, and 23B, a portion of the sacrificial layer 183 and a portion of the support pattern layer 171P, that vertically overlaps with openings of the photoresist pattern PR, may be etched away by using the photoresist pattern PR as an etching mask. Thereafter, the photoresist pattern PR may be removed. As a result of the partial removing, the support pattern layer 171P may be formed into a support 171 having the support pattern SP and the opening area OP. The opening area OP of the support 171 may be provided as a space into which a wet etching solution is supplied in a subsequent wet etching process.

Referring to FIGS. 23A, 23B, 24A, and 24B, the sacrificial layer 183 and the mold pattern 181P may be removed by a wet etching process. A wet etching process for removing the mold pattern 181P may be performed by using a wet etching solution, such as hydrofluoric acid and a buffered oxide etchant (BOE) solution. In the wet etching process, a wet etching solution may be supplied to the mold pattern 181P through the opening area OP of the support 171.

Thereafter, as illustrated in FIGS. 2A and 2B, a dielectric layer 164 may be formed to conformally cover the lower electrode 162 and the support 171, and the upper electrode 166 may be formed on an entire surface of the dielectric layer 164. As the source gas and the reaction gas may be sufficiently supplied through the opening area OP of the support 171, the dielectric layer 164 and the upper electrode 166 may be smoothly and uniformly formed.

The dielectric layer 164 may be conformally formed on a surface of the lower electrode 162, a surface of the support 171, and an upper surface of the etch stop pattern 154. The dielectric layer 164 may include at least one material selected from silicon oxide, silicon nitride, silicon oxynitride, and a high dielectric material.

The upper electrode 166 may entirely fill a portion where the mold pattern 181P and the sacrificial layer 183 are removed. The upper electrode 166 may include any one of a metal nitride, a metal, and a combination thereof. For example, the upper electrode 166 may include at least one material selected from titanium nitride (TiN), ruthenium (Ru), tantalum nitride (TaN), tungsten nitride (WN), platinum (Pt), and iridium (Jr). The upper electrode 166 may be formed by a chemical vapor deposition (CVD) process or an atomic layer deposition (ALD) process.

According to conventional integrated circuit devices in which the active areas are arranged in an oblique direction crossing both of the bit line direction and the word line direction, there has been difficulties in obtaining a process window due to a narrow design node in the process of forming a connecting structure between the capacitor and the active area. However, according to some example embodiments, as the bit line and the word line are buried in the substrate and the active area of the substrate has a straight structure extending in parallel with the bit line, the process window may be sufficiently obtained in the process of forming a connecting structure (e.g., a landing pad) between the active area and the capacitor structure. Accordingly, the process difficulty may be sufficiently reduced in manufacturing the integrated circuit devices, and the reliability of the electrical connection may be improved between circuit patterns, to thereby improve the reliability of the integrated circuit devices.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

While the inventive concepts have been particularly shown and described with reference to example embodiments thereof, it will be understood that various changes in form and details may be made therein without departing from the spirit and scope of the following claims.

What is claimed is:

1. An integrated circuit device comprising:
   a substrate including a first active area and a second active area each extending in a first direction;
   a bit line extending in the first direction in a first trench of the substrate and arranged between the first active area and the second active area in a second direction perpendicular to the first direction;

a first capping insulation layer on the bit line in the first trench of the substrate;

a first spacer between the substrate and the bit line;

a contact structure including a lower contact and an upper contact on the lower contact, the lower contact being in contact with the bit line and the upper contact being in contact with the first active area;

a word line extending in the second direction in a second trench of the substrate;

a second capping insulation layer on the word line in the second trench of the substrate;

a second spacer between the substrate and the word line;

a plurality of landing pads on the substrate; and a capacitor structure including a plurality of lower electrodes on the plurality of landing pads, an upper electrode over the plurality of lower electrodes, and a dielectric film between the plurality of lower electrodes and the upper electrode, the bit line and the word line being buried under an upper surface of the substrate, and the plurality of landing pads being on the upper surface of the substrate.

2. The integrated circuit device of claim 1, wherein an upper surface of the contact structure is at a vertical level equal to or lower than the upper surface of the substrate.

3. The integrated circuit device of claim 1, wherein a distance between the bit line and the upper surface of the substrate is greater than a distance between the word line and the upper surface of the substrate.

4. The integrated circuit device of claim 1, wherein the first spacer includes a first portion extending along a sidewall of the substrate defining the first trench, and the lower contact extends along the first portion of the first spacer.

5. The integrated circuit device of claim 1, wherein the first active area has a recessed surface thereon, and the upper contact protrudes laterally from the lower contact in the second direction and contacts the recessed surface of the first active area.

6. The integrated circuit device of claim 1, wherein a length of the upper contact in the second direction is greater than that of the lower contact in the second direction.

7. The integrated circuit device of claim 1, further comprising:

a contact cover insulating layer covering the contact structure.

8. The integrated circuit device of claim 1, wherein the plurality of lower electrodes are arranged in a honeycomb structure.

9. The integrated circuit device of claim 8, wherein the honeycomb structure includes six lower electrodes positioned at six vertexes of a hexagon and a single lower electrode positioned at a center point of the hexagon.

10. The integrated circuit device of claim 9, wherein a first line connecting center points of a pair of most neighboring lower electrodes among the plurality of lower electrodes in the first direction has a first length in the first direction, a second line connecting center points of a pair of most neighboring lower electrodes in a direction crossing the first direction and the second direction among the plurality of lower electrodes has a second length in the second direction, and the first length is greater than the second length.

11. The integrated circuit device of claim 8, further comprising:

a support configured to connect the plurality of lower electrodes to each other to support the plurality of lower electrodes, and including a plurality of opening areas.

12. The integrated circuit device of claim 1, further comprising:

two device isolation layers in the substrate, the two device isolation layers spaced apart in the first direction with the first active area therebetween.

13. The integrated circuit device of claim 1, wherein the first active area includes source/drain regions divided in the first direction, and some of the source/drain regions are in contact with the contact structure, and a rest of the source/drain regions are in contact with the plurality of landing pads.

14. An integrated circuit device comprising:

a substrate including an active area extending in a first direction;

at least one pair of device isolation layers in the substrate, the at least one pair of device isolation spaced apart in the first direction with the active area therebetween;

a bit line buried in the substrate and extending in the first direction;

a plurality of word lines buried in the substrate and extending in a second direction perpendicular to the first direction;

a contact structure including a lower contact connected to the bit line and an upper contact connected to an upper portion of the active area;

a plurality of landing pads on the substrate; and a capacitor structure including a plurality of lower electrodes positioned on the plurality of landing pads, respectively, the active area including source/drain regions divided by the plurality of word lines in the first direction, and some of the source/drain regions being in contact with the upper contact, and a rest of the source/drain regions being in contact with the plurality of landing pads.

15. The integrated circuit device of claim 14, wherein the bit line and the plurality of word lines are under an upper surface of the substrate, the plurality of landing pads is on the upper surface of the substrate, and an upper surface of the contact structure is at a level equal to or lower than the upper surface of the substrate.

16. The integrated circuit device of claim 15, further comprising:

a first capping insulation layer on the bit line; and a first spacer positioned between the bit line and the substrate and between the lower contact and the substrate, wherein the lower contact extends along the first spacer, and the upper contact extends laterally beyond the first spacer.

17. The integrated circuit device of claim 16, wherein the first spacer includes silicon nitride, and the first capping insulation layer includes silicon oxide.

18. The integrated circuit device of claim 14, wherein the plurality of lower electrodes are arranged in a honeycomb structure, and the honeycomb structure includes six lower electrodes positioned at six vertexes of a hexagon and a single lower electrode positioned at a center point of the hexagon.

19. The integrated circuit device of claim 18, wherein among the plurality of the lower electrodes, a pair of most neighboring lower electrodes are arranged in a line in the first direction.

20. An integrated circuit device comprising:

a substrate including a first active area and a second active area each extending in a first direction;

a bit line extending in the first direction in a first trench of the substrate and arranged between the first active area and the second active area in a second direction perpendicular to the first direction;

a first capping insulation layer on the bit line;

a contact structure including a lower contact and an upper contact on the lower contact, the lower contact being in contact with the bit line and the upper contact being in contact with the first active area;

a first spacer positioned between the substrate and the bit line and between the substrate and the lower contact, the first spacer contacting the lower contact;

two device isolation layers in the substrate, the two device isolation layers spaced apart in the first direction with the first active area therebetween;

a plurality of word lines extending in the second direction and arranged in a plurality of second trenches provided in the substrate, the plurality of second trenches passing through the first active area in the second direction;

a plurality of second capping insulation layers positioned on the plurality of word lines, respectively;

a plurality of second spacers arranged between the substrate and the plurality of word lines, respectively;

a plurality of landing pads on the substrate; and a capacitor structure including a plurality of lower electrodes on the plurality of landing pads, respectively, an upper electrode over the plurality of lower electrodes, and a dielectric film between the plurality of lower electrodes and the upper electrode, the bit line, the contact structure, and the plurality of word lines being buried under an upper surface of the substrate, the plurality of landing pads being on the upper surface of the substrate, and a pair of most neighboring lower electrodes among the plurality of the lower electrodes being arranged in a line in the first direction.

* * * * *